(12) United States Patent
Cook et al.

(10) Patent No.: US 8,849,886 B2
(45) Date of Patent: Sep. 30, 2014

(54) PASSIVE DISCRETE TIME ANALOG FILTER

(75) Inventors: Benjamin W. Cook, San Francisco, CA (US); Axel D. Berny, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 509 days.

(21) Appl. No.: 13/188,453

(22) Filed: Jul. 21, 2011

(65) Prior Publication Data

US 2012/0218053 A1 Aug. 30, 2012

Related U.S. Application Data

(60) Provisional application No. 61/366,388, filed on Jul. 21, 2010.

(51) Int. Cl.
*G06G 7/02* (2006.01)
*H03H 15/00* (2006.01)

(52) U.S. Cl.
CPC ................. *H03H 15/023* (2013.01)
USPC ........................................................ 708/819

(58) Field of Classification Search
CPC ..... H03H 15/00; H03H 15/02; H03H 19/004; H03H 11/04; G06G 7/1928
USPC ........................................................ 708/819
See application file for complete search history.

(56) References Cited

U.S. PATENT DOCUMENTS

| | | | |
|---|---|---|---|
| 3,564,146 A * | 2/1971 | Poschenrieder et al. ...... | 370/308 |
| 4,284,909 A | 8/1981 | Tiemann | |
| 5,325,322 A | 6/1994 | Bailey et al. | |
| 5,535,150 A | 7/1996 | Chiang | |
| 5,887,025 A | 3/1999 | Nagazumi | |
| 6,035,320 A | 3/2000 | Kiriaki et al. | |
| 6,553,398 B2 | 4/2003 | Capofreddi | |
| 7,565,393 B2 | 7/2009 | Lakdawala et al. | |
| 2009/0002066 A1 | 1/2009 | Lee et al. | |
| 2009/0134916 A1 | 5/2009 | Iida et al. | |

FOREIGN PATENT DOCUMENTS

| | | |
|---|---|---|
| JP | 58057815 | 4/1983 |
| WO | 2009158537 | 12/2009 |

OTHER PUBLICATIONS

Chen, Feng et al. "A 0.25mW Low-Pass Passive Sigma-Delta Modulator with Built-In Mixer for a 10-MHz IF Input." IEEE Journal of Solid-State Circuits, vol. 32, No. 6, Jun. 1997. pp. 774-782.

Ranganathan, Sanjeev et al. "Discrete-Time Parametric Amplification Based on a Three-Terminal MOS Varactor: Analysis and Experimental Results." IEEE Journal of Solid-State Circuits, vol. 38, No. 12, Dec. 2003. pp. 2087-2093.

\* cited by examiner

*Primary Examiner* — Tan V. Mai

(57) ABSTRACT

A discrete-time analog filter including multiple storage cells each coupled to common input and output ports and each including at least one of capacitor and at least one switch. Each cell periodically samples an input signal and contributes to an output signal. At least two cells sample the input signal at different frequencies. The cells may be grouped together into one or more filter taps, where each filter tap may have a specified timing delay. Timing signals of a given tap may be non-overlapping phases of a given frequency. Cells may have a fixed or programmable capacitance associated with a corresponding weighting coefficient, and different taps may have different weighting coefficients. Taps may be coupled to implement a negative weighting coefficient. Programmable gain may be implemented with switches or by tap output coupling including sub-filter summing arrangements. Self-timed cells based on a master clock are disclosed.

17 Claims, 30 Drawing Sheets

FIG. 3A
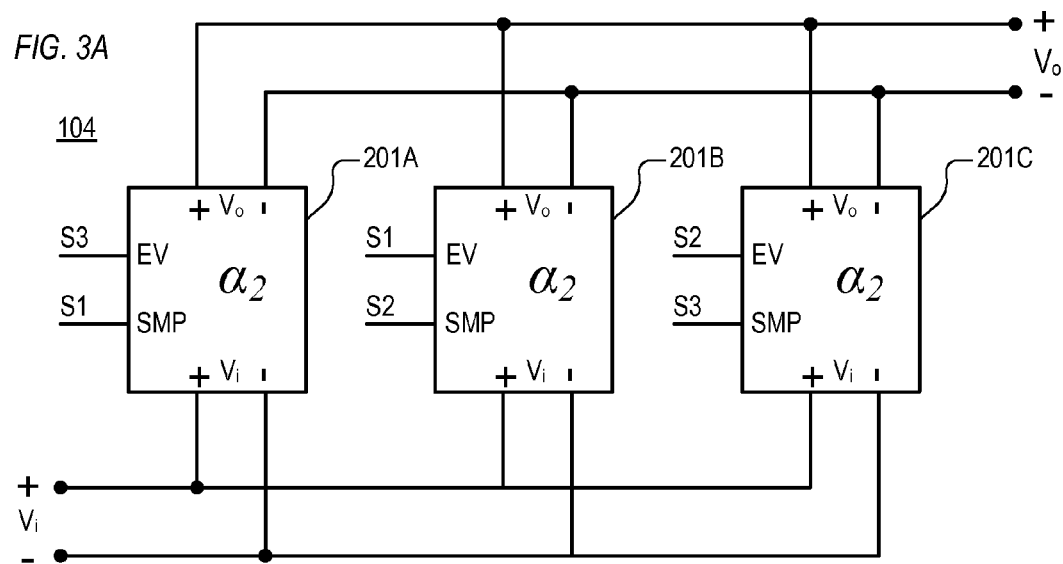
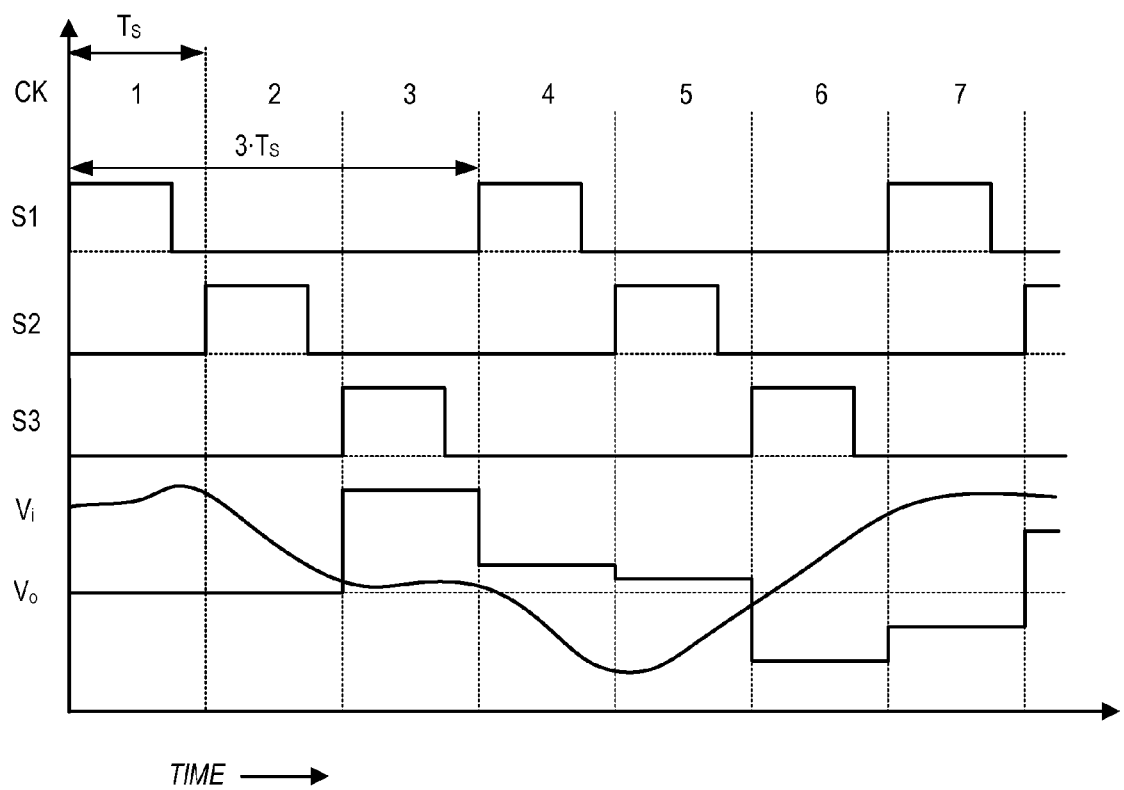
FIG. 3B

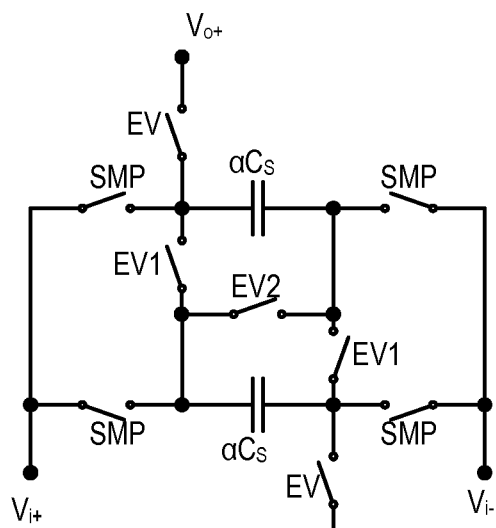
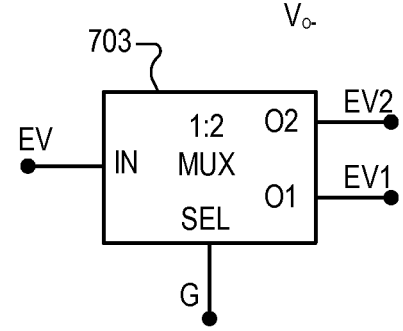
FIG. 7A
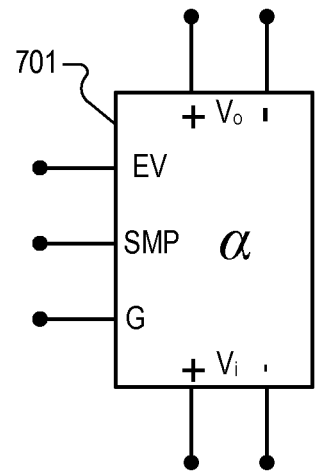
FIG. 7B

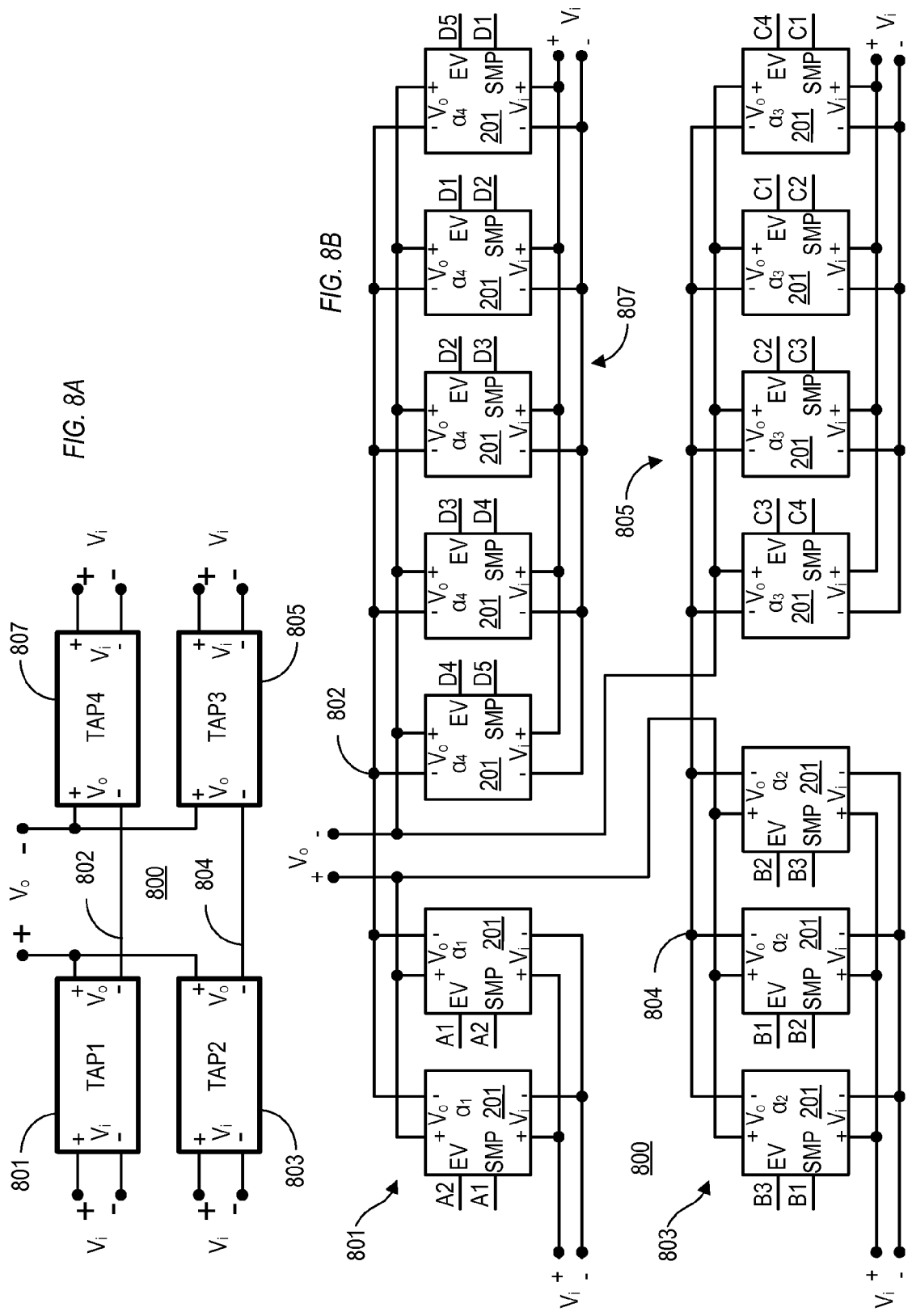

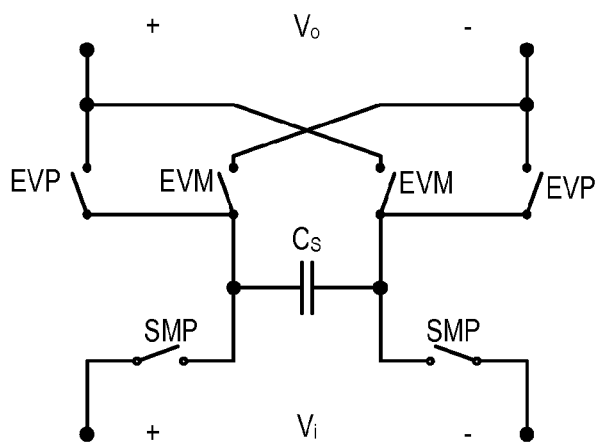
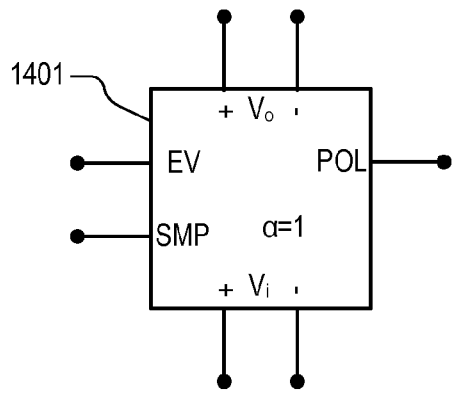
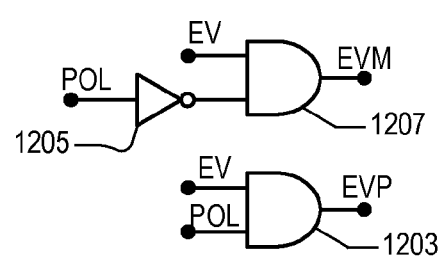
FIG. 14A
FIG. 14B

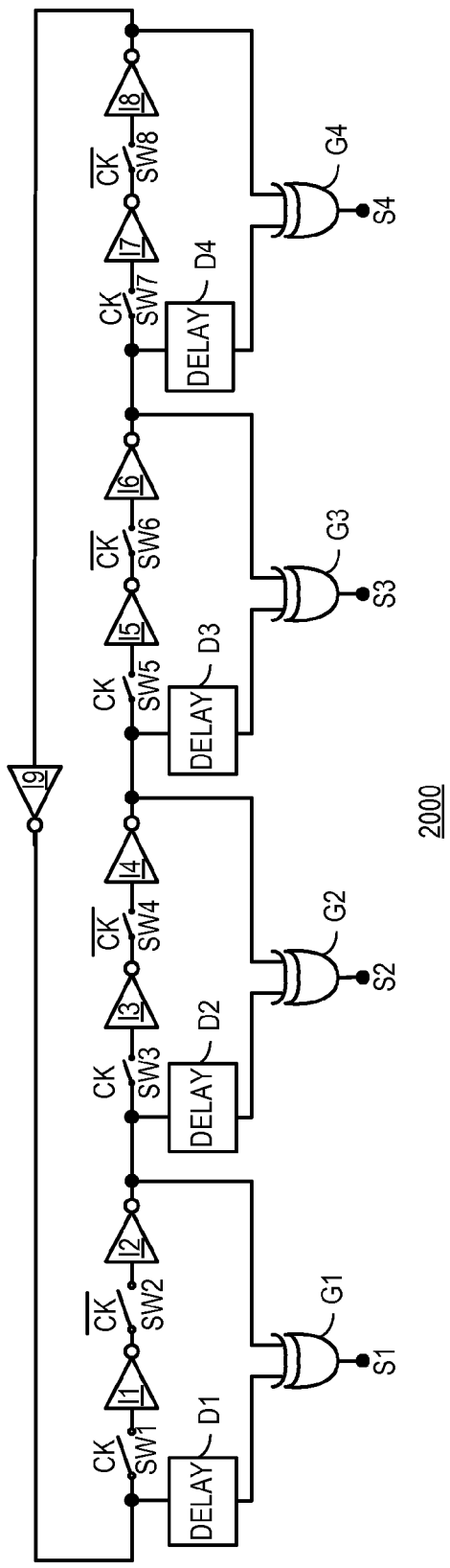
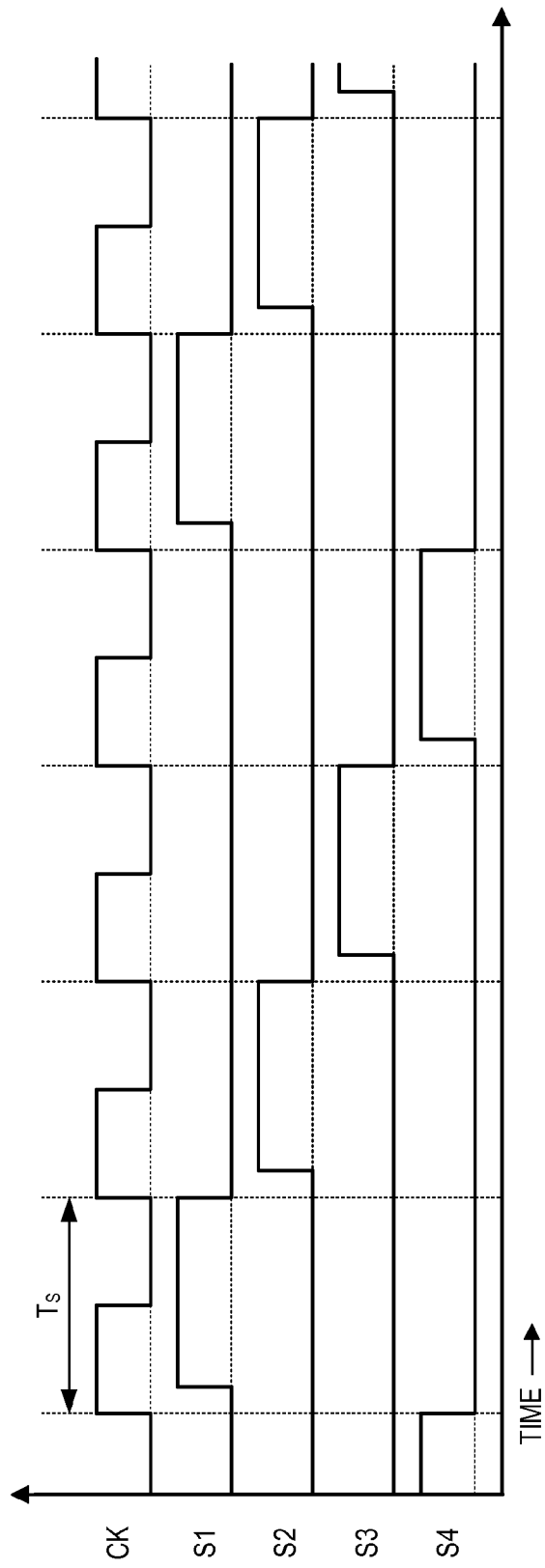
FIG. 20A
FIG. 20B

PASSIVE DISCRETE TIME ANALOG FILTER

CROSS-REFERENCE TO RELATED APPLICATIONS

This application claims the benefit of U.S. Provisional Application Ser. No. 61/366,388, filed on Jul. 21, 2010 which is herein incorporated by reference in its entirety for all intents and purposes.

BACKGROUND OF THE INVENTION

1. Field of the Invention

The present invention relates generally to filters, and more particularly to a system and method of passive discrete time analog filtering which provides a low-power, low-noise method for implementing a transfer function based on finite impulse response (FIR) sections with predetermined or programmable filter taps and voltage gain utilizing primarily switches and capacitors.

2. Description of the Related Art

Analog finite impulse response (FIR) implementations have employed switched capacitor sampling combined with active feedback amplifiers to provide weighting factors for delayed samples and to combine the samples in order to produce a filtered output signal. Active amplifiers consume a significant amount of power and add noise and distortion to the output signal.

BRIEF DESCRIPTION OF THE DRAWINGS

The benefits, features, and advantages of the present invention will become better understood with regard to the following description, and accompanying drawings where:

FIG. 3A is a schematic diagram of an implementation of the second tap of the passive discrete time analog filter of FIG. 1 using the unit charge storage cell of FIG. 2A and FIG. 3B is a corresponding timing diagram;

FIG. 7A is a schematic diagram of an exemplary programmable charge storage cell implemented according to another embodiment with programmable voltage gain and FIG. 7B is a corresponding circuit symbol;

FIG. 8A is a simplified block diagram of a 4-tap filter according to one embodiment which achieves a gain of 2 V/V using series connection taps and FIG. 8B is a simplified block diagram of the 4-tap filter according to a more specific embodiment implemented using the unit charge storage cell of FIG. 2A;

FIG. 14A is a programmable charge storage cell with programmable polarity according to one embodiment, and FIG. 14B shows a corresponding circuit symbol;

FIG. 20A is a schematic diagram of another dynamic circuit which may be used in another more specific embodiment of the system of FIG. 17, and FIG. 20B is a corresponding timing diagram;

DETAILED DESCRIPTION

Figure 1A:
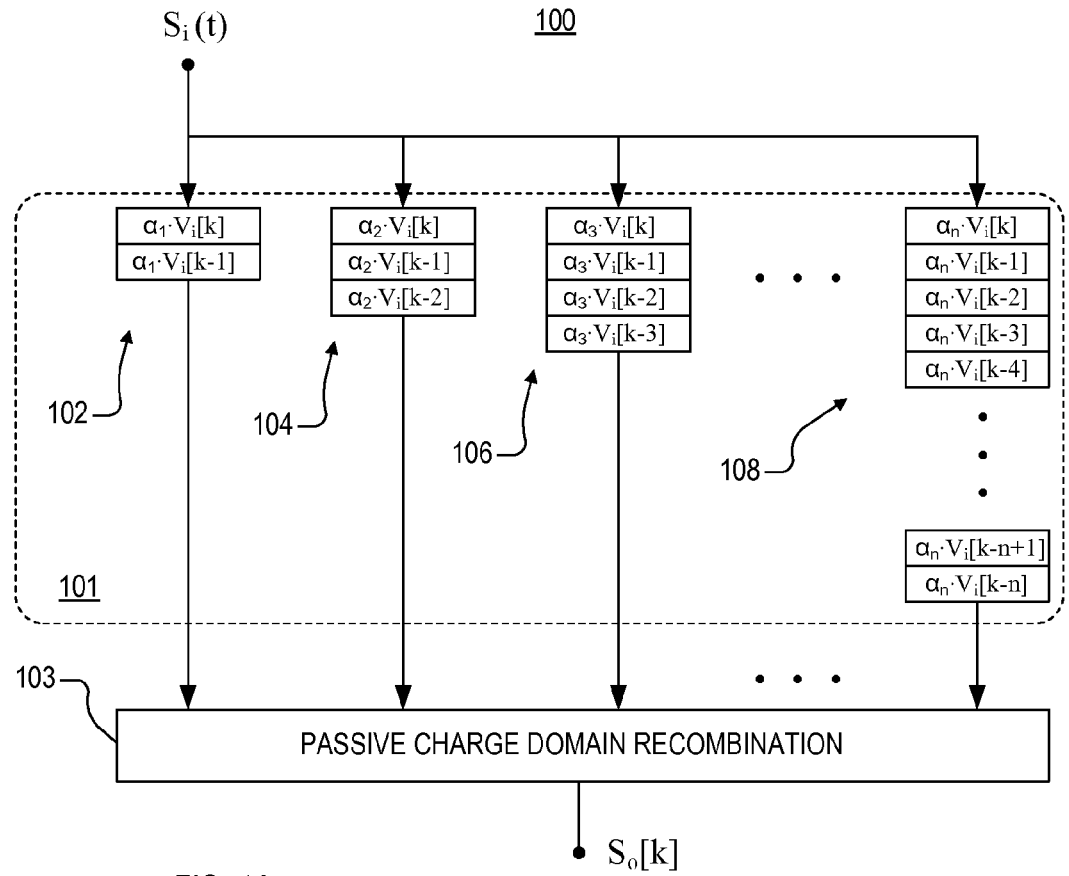
FIG. 1A is a conceptual block diagram of a passive discrete time analog filter implemented according to one embodiment.

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

A system and method as described herein provides a low-power, low-noise method for implementing a discrete-time analog filters based on finite impulse response (FIR) sections with predetermined or programmable taps and predetermined or programmable voltage gain utilizing primarily switches and capacitors. At least one benefit of this technique compared to conventional analog filter configurations is that it does not rely on active amplifiers which are typically used to implement the transfer function, resulting in significant power savings and lower noise and distortion. In this manner, the output signal energy is substantially composed of input signal energy by virtue of passive signal processing.

Given a discrete-time input sequence x[n], the corresponding output sequence y[n] can be expressed as a function of x[n] as shown by the following equation (1):

$$y[n] = \alpha_0 \cdot x[n] + \alpha_1 \cdot x[n-1] + \alpha_2 \cdot x[n-2] + \ldots + \alpha_k \cdot x[n-k] \quad (1)$$

in which y[n] is developed by summing an integer number k+1 of delayed samples of x[n] and assigning a weight $\alpha_z$ to each delayed sample, and in which the subscript "z" denotes a different weight "$\alpha$" applied to each delayed sample. Certain input signals in the context of this disclosure are continuous-time analog signals, which may be voltage or current input signals. For instance, a continuous-time input signal $S_i(t)$ may first be sampled to create the corresponding discrete sequence of stored voltage samples $V_i[n]$. Methods used to implement a discrete finite impulse response in the analog domain include a method for sampling an input signal $S_i(t)$, and storing a corresponding voltage sample, a method for delaying a given voltage sample by a desired time period, such as a specific number clock cycles, a method for assigning a weight to each delayed sample, a method for combining the weighted and/or delayed samples to produce a filtered output signal, and optionally, a method for zeroing out or resetting stored voltage samples.

A continuous-time input signal may be sampled and stored onto one or more switchably coupled capacitors $C_i$, in which "i" is an index for referencing individual capacitors of a given filter. The capacitance of the capacitors $C_i$ may vary as further described below. Each capacitor $C_i$ may store its voltage sample until it is coupled to the output. In one embodiment, each capacitor $C_i$ may be part of a sub-group of similar storage cells, which may be referred to herein as a tap of a filter. The constituent storage cells of a tap may sample an input signal using a common sampling frequency that is directly related to the length of a delay between sampling an input signal and combining with an output signal. Further, the constituent storage cells of a tap may have a substantially equal capacitance value, wherein the capacitance value may determine a weight factor, herein referred to as a tap value, for the samples stored by the tap. The polarity of the tap value may be made negative by inverting the polarity of the sample capacitor when it is coupled to the output. Samples may be combined in the charge domain (i.e. charge sharing) by providing a switchable path from each capacitor $C_i$ to the output port. This switchable path may provide a direct connection or a series connection comprised of other capacitors and switches.

The embodiments described herein implement a discrete time transfer function based on a finite impulse response (FIR) without using amplifiers, resulting in a fully passive architecture. An input signal x[n] is sampled at n=0 (i.e. the first clock cycle) and stored on one or more of capacitors. Each sampling capacitor $C_i$ holds its stored voltage for a specified number of clock cycles (or ½ cycles) before it is evaluated at the output. Individual capacitors may wait a different number of cycles before evaluating to the output, thereby allowing multiple delayed versions of x[n] to be available for evaluation at the output simultaneously. The value of each capacitor $C_i$ sampled at n=0 is chosen to set the weight $\alpha_z$ associated with its delay. Combination of delayed input samples is done passively; a multitude of capacitors containing stored voltage samples may be connected together to a common output port where their stored voltage samples may be combined with the appropriate weighting due to charge sharing. Hence, each sample may be corrupted once it is evaluated at the output. After evaluation at the output, each capacitor is re-coupled to the input to obtain a new sample. In one embodiment, each capacitor may be reset or zeroed out after evaluation at the output, before it is re-coupled to obtain a new sample.

Figure 1B:
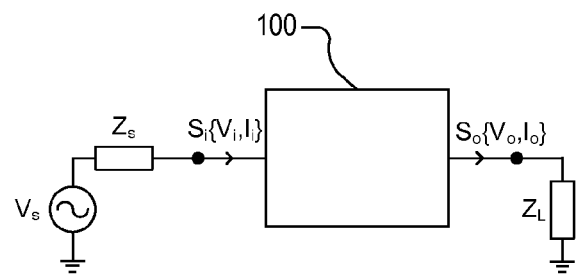
FIG. 1B is a block diagram illustrating the filter of FIG. 1A coupled to an input source Vs with impedance $Z_S$ and to an output load $Z_L$.

FIG. 1A is a conceptual block diagram of a passive discrete time analog filter 100 implemented according to one embodiment receiving a time-varying analog input signal voltage, labeled $S_i(t)$, and providing an analog output signal $S_o[k]$ sampled at a sampling frequency $f_S$ (with a sampling period $T_S$, where $T_S=1/f_S$). FIG. 1B is a block diagram illustrating the filter 100 coupled to an input source Vs with impedance $Z_S$ and to an output load $Z_L$. As illustrated in FIG. 1B, $S_i(t)$ and $S_o[k]$ each include a current signal and a voltage signal. The storage elements store a voltage sample corresponding to an instantaneous voltage $S_i(t)$ and combine to create an output signal $S_o[k]$. While in certain embodiments $S_i(t)$ and $S_o[k]$ may be regarded as predominantly current-mode or voltage-mode signals, they comprise of both currents and voltages in general. The description herein will deal primarily with voltages for the sake of simplicity. The value "k" is a sampling index for sampling the input signal $S_i(t)$, such that a given input sample $V_i[k]=V_i(k \cdot T_S+t_0)$ in which "$t_0$" is an initial time and $V_i(t)$ is the instantaneous voltage of the input signal $S_i(t)$. The filter 100 includes a passive sampling, charge storage and time delay block 101 receiving $S_i(t)$ and providing respective outputs to corresponding inputs of a passive charge domain recombination block 103 having an output providing the output signal $S_o[k]$. The passive sampling, charge storage and time delay block 101 includes a set of "n" filter taps 102, 104, 106, ..., 108 in which each tap is implemented using one or more unit charge storage cells. The outputs of the taps 102-108 are provided to respective inputs of the passive charge domain recombination block 103. The passive charge domain recombination block 103 outputs $S_o[k]$, which may be expressed according to the following equation (2):

$$S_o[k] = \frac{\alpha_1 \cdot V_i[k-1] + \alpha_2 \cdot V_i[k-2] + \ldots \alpha_n \cdot V_i[k-n]}{M} \quad (2)$$

in which "M" is a constant scaling factor related to the weight values $\alpha_1 - \alpha_n$.

The first tap 102 has two unit charge storage cells each having a weight value of $\alpha_1$, including a first cell which stores a sample of the input $V_i(t)$ at time k (shown as $\alpha_1 \cdot V_i[k]$) and a second cell which stores a sample of the input $V_i(t)$ at time k−1 (shown as $\alpha_1 \cdot V_i[k-1]$). The first tap 102 represents a delay of one (1) clock cycle in which the clock has a period of $T_S$. The second tap 104 has three unit charge storage cells each having a weight value of $\alpha_2$, including a first cell which stores a sample of the input $V_i(t)$ at time k (shown as $\alpha_2 \cdot V_i[k]$), a second cell which stores a sample of the input $S_i(t)$ at time k−1 (shown as $\alpha_2 \cdot V_i[k-1]$), and a third cell which stores a sample of the input $S_i(t)$ at time k−2 (shown as $\alpha_2 \cdot V_i[k-2]$). The second tap 104 represents a delay of two (2) clock cycles. The third tap 106 has four unit charge storage cells each having a weight value of $\alpha_3$ and represents a delay of three (3) clock cycles, and so on up to the last or nth tap 108, which has an integer number "n+1" of unit charge storage cells each having a weight value of $\alpha_n$ representing a delay of n clock cycles.

Figure 2A:
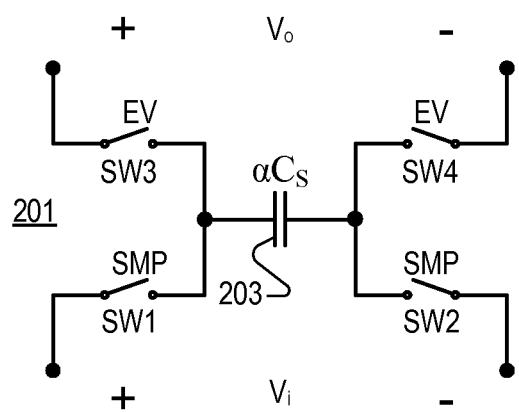
FIG. 2A is a schematic diagram of an exemplary unit charge storage cell implemented according to one embodiment and FIG. 2B is a corresponding circuit symbol.

FIG. 2A is a schematic diagram of an exemplary unit charge storage cell 201 implemented according to one embodiment. The unit charge storage cell 201 includes four single-pole, single-throw (SPST) switches SW1-SW4, in which each switch may be implemented by suitable metal-oxide semiconductor (MOS) or bipolar junction transistor (BJT) transistor devices or the like. The first switch SW1 has a pair of terminals coupled between a positive polarity of the input voltage $V_i$ (e.g., $V_i+$) and a first end of a sample capacitor 203, and the second switch SW2 has a pair of terminals coupled between a negative polarity of the input voltage $V_i$ (e.g., $V_i−$) and a second end of the sample capacitor 203. The third switch SW3 has a pair of terminals coupled between a positive polarity of the output voltage $V_O$ ($V_o+$) and the first end of the sample capacitor 203, and the fourth switch SW4 has a pair of terminals coupled between a negative polarity of the output voltage $V_o$ ($V_o−$) and the second end of the sample capacitor 203. Each of the switches SW1-SW4 has a control input receiving a control signal, in which the switch is opened when the control signal is low (e.g. asserted low or a logic false) and is closed when the control signal is asserted high. SW1 and SW2 are controlled by a sample signal SMP, and SW3 and SW4 are controlled by an evaluation signal EV. It is understood by one of ordinary skill in the art that the exemplary embodiment of FIG. 2A and subsequently described embodiments utilizing differential input and output signals may alternatively be implemented to process single-ended input and/or output signals.

The sample capacitor 203 has a capacitance value shown as "$\alpha C_S$" which collectively represents the weight of the sample of the unit charge storage cell 201. $C_S$ is a "unitary" or common capacitance value among the sampling capacitors of a given filter, in which the weight factor "$\alpha$" multiplied by $C_S$ determines the capacitance of a given sampling capacitor.

In operation, SMP is asserted high to close both sampling switches SW1 and SW2 while EV is asserted low to open the evaluation switches SW3 and SW4 so that the capacitor 203 is charged with the differential voltage of the input signal $V_i$ (across $V_i+$ and $V_i−$). SMP is then asserted low and EV is asserted high so that the sampled value is applied to the differential output terminals $V_o$ (across $V_o+$ and $V_o−$). The relative timing between the control signals SMP and EV determines the relative delay of the unit charge storage cell 201.

Figure 2B:
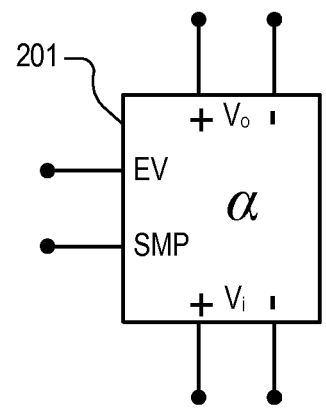

FIG. 2B is a corresponding circuit symbol representing the unit charge storage cell 201. The circuit symbol includes a pair of input terminals for sampling the input $V_i$, a pair of output terminals for providing the sampled value to the output $V_o$, and a pair of input terminals for receiving the sample and evaluation control signals SMP and EV. A weight value "$\alpha$" denotes the weight of the unit charge storage cell 201 which directly corresponds with the relative capacitance of the sample capacitor within the unit charge storage cell 201. For example, each of the unit charge storage cells of the first tap 102 of the passive discrete time analog filter 100 has a weight of "$\alpha_1$" indicative of the relative capacitance of the sample capacitor within each unit charge storage cell.

Figure 2C:
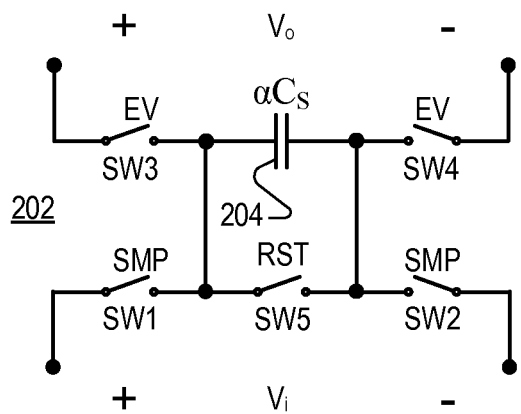
FIG. 2C is a schematic diagram of an exemplary unit charge storage cell similar to that illustrated in FIG. 2A, except including resetting switch.

FIG. 2C is a schematic diagram of an exemplary unit charge storage cell 202 similar to that illustrated in FIG. 2A, except that a resetting switch SW5 is included to periodically zero out the voltage held on the sample capacitor 204, as may be desired in certain embodiments where the input signal impedance is high corresponding to a predominantly current-mode drive.

Figure 2D:
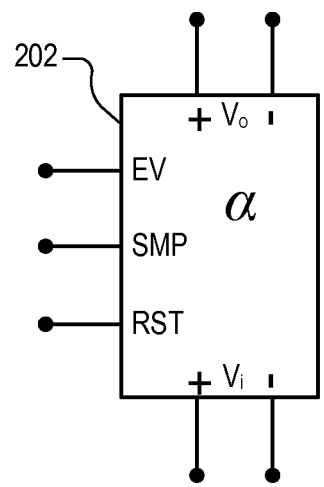
FIG. 2D is a corresponding circuit symbol of the cell of FIG. 2C.

FIG. 2D is a corresponding circuit symbol representing the unit charge storage cell 202. The circuit symbol includes a pair of input terminals for sampling the input $V_i$, a pair of output terminals for providing the sampled value to the output $V_o$, and three input terminals for receiving the sample, evaluation and reset control signals SMP, EV, and RST. A weight value "$\alpha$" denotes the weight of the unit charge storage cell 202 which directly corresponds with the relative capacitance of the sample capacitor within the unit charge storage cell 202.

FIG. 3A is a schematic diagram of an implementation of the second tap 104 of the passive discrete time analog filter 100 using the unit charge storage cell 201, labeled individually as cells 201A, 201B and 201C. In one embodiment, each cell 201A-C is a specific configuration of the unit charge storage cell 201. The positive polarity input terminal of each of the cells 201A-C are coupled together and to the positive polarity of an input signal $V_i$ and the negative polarity input terminal of each of the cells 201A-C are coupled together and to the negative polarity of the input signal $V_i$, where the input signal is the input signal $V_i(t)$ provided to the passive discrete time analog filter 100 shown in FIG. 1. In a similar manner, the positive output terminals are coupled together to the positive polarity and the negative output terminals are coupled together to the negative polarity of an output terminal $V_o$, which represents the output of the second tap 104 provided to the passive charge domain recombination block 103 of the passive discrete time analog filter 100. Hence, each storage cell shares a dedicated common input port and a dedicated common output port, allowing passive discrete time analog filter 100 to simultaneously sample the input signal with a portion of the storage cells while others of said storage cells are combining charges to create an output signal. Each of the cells 201A-C are configured with a weight of "$\alpha_2$" corresponding with the weight of each cell of the second tap 104. The cells 201A-C receive timing signals S1, S2 and S3, respectively, at their corresponding sample inputs, and receive timing signals S3, S1 and S2, respectively, at their corresponding evaluation input. The timing signals S1-S3 may alternatively be referred to as control signals or clock signals.

FIG. 3B is a timing diagram plotting the timing signals S1, S2, and S3, an exemplary input signal $V_i$ and the corresponding output signal $V_o$ of the embodiment of the second tap 104 shown in FIG. 3A versus time. A clock signal CK shows the consecutive cycles of a sampling period $T_S$ illustrating delay between assertions of the control signals S1-S3. The overall sampling period of tap 104 is Ts, but the sampling period of each of the storage cells 201A-C individually is 3·Ts, where each storage cell samples the input in response to multiple non-overlapping phases of control signals having a frequency of fs/3 (in which Ts=1/fs). The input and output signals $V_i$ and $V_o$ are superimposed together in which $V_o$ develops as a discrete delayed version of $V_i$. As illustrated in the timing diagram of FIG. 3B and the schematic of FIG. 3A, tap 104 may sample the input signal and simultaneously provide a stored sample to the output. As a result, tap 104 may utilize up to a full cycle of the sampling clock (i.e. a time period approaching $T_S$) to capture samples from the input signal, which may maximize signal transfer from the input signal to the storage cells. With reference to FIGS. 3A and 3B, initially S1 is asserted high while S2 and S3 are asserted low during the first clock cycle (CK=1) so that the first unit charge storage cell 201A samples the input $V_i$ while it is relatively high, and at the same time, the evaluation control input of the second unit charge storage cell 201B provides its output to $V_o$, but in this case it is assumed that there was no previous sample taken so that the output is zero. In the second clock cycle (CK=2), S2 is asserted high while S1 and S3 are both low. Thus, the second unit charge storage cell 201B samples the input in the second clock cycle while $V_i$ is falling. Although the third unit charge storage cell 201C provides its output to $V_o$, it is assumed to be zero. In the third clock cycle, S3 is asserted high while S1 and S2 are low. At this time, the third unit charge storage cell 201C samples the input while the first unit charge storage cell 201A provides its previous sample of the input to the output. The output signal $V_o$ jumps to a voltage indicative of the stored voltage level of $V_i$ in the first clock cycle when sampled by cell 201B.

In the fourth clock cycle, S3 goes low and S1 goes high so that cell 201A takes a new input sample while cell 201B outputs its sample, and the output $V_o$ jumps to a lower discrete voltage level. Operation repeats in round-robin fashion in which the control signals S1-S3 are sequentially asserted high one at a time each at a frequency of $f_S/3$ (in which $T_S=1/f_S$). $V_o$ develops as a time-varying voltage having discrete voltage levels during each clock cycle, as understood by those of ordinary skill in the art. With reference to the passive discrete time analog filter 100 of FIG. 1, the output $V_o[k]$ is generated as a combination of the outputs of each of the n taps 102-108.

Figure 4:
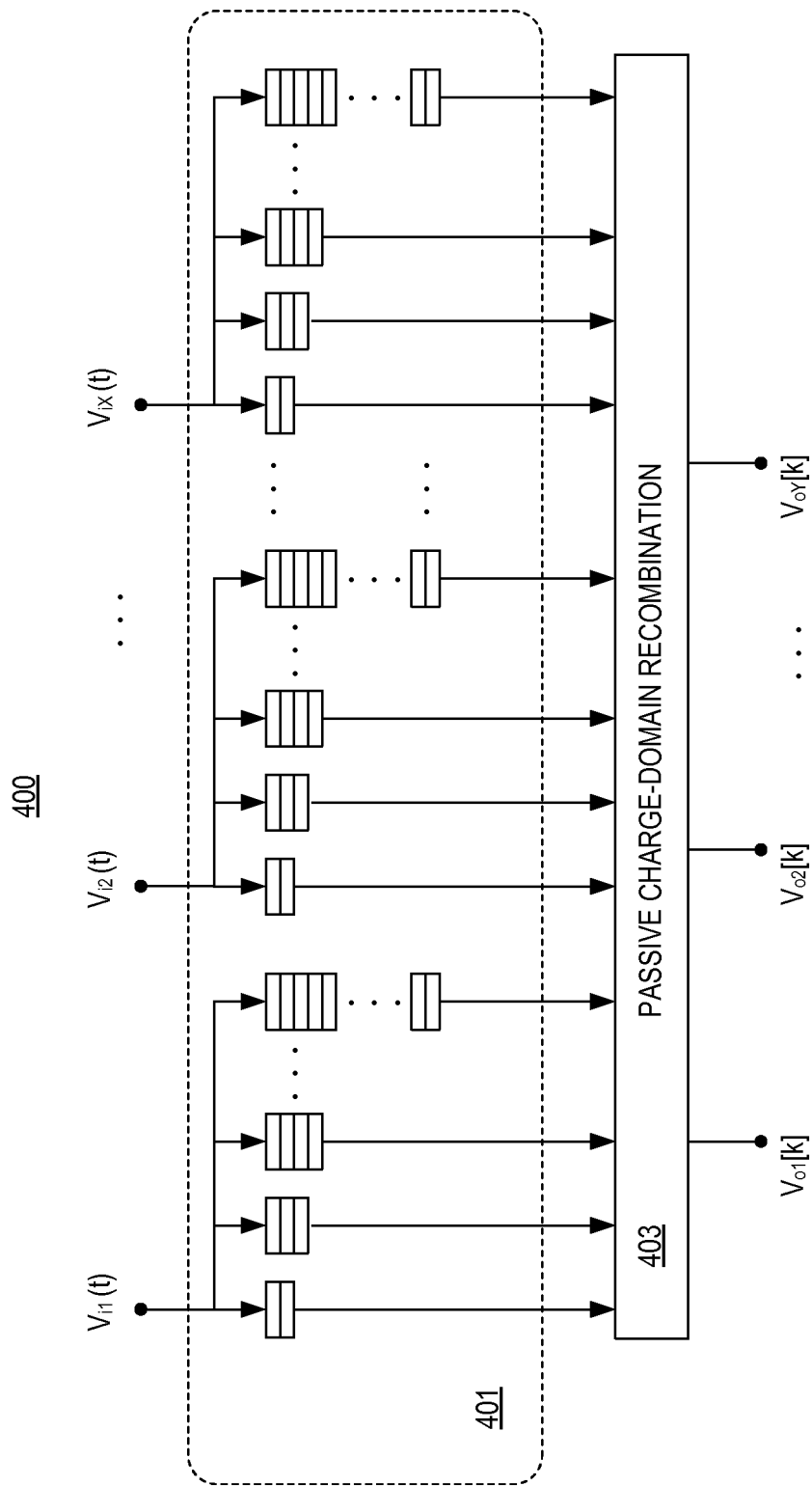
FIG. 4 is a conceptual block diagram of a passive discrete time analog filter implemented according to one embodiment receiving multiple time-varying analog input voltages and providing one or more filtered output voltages.

FIG. 4 is a conceptual block diagram of a passive discrete time analog filter 400 implemented according to one embodiment receiving multiple time-varying analog input voltages $V_{iq}(t)$ and providing one or more filtered output voltages $V_{oj}[k]$, in which "q" is an input voltage index from 1 to an integer "X" and "j" is an output voltage index from 1 to an integer "Y". The passive discrete time analog filter 400 includes a passive sampling, charge storage and time delay block 401 receiving $V_{iq}(t)$ providing respective outputs to corresponding inputs of a passive charge domain recombination block 403 providing the output voltages $V_{oj}[k]$. The passive discrete time analog filter 400 is a generalized version of the passive discrete time analog filter 100 combining multiple input signals to generate one or more filtered output signals. The passive sampling, charge storage and time delay block 401 is similar to the block 101, except that it includes multiple sets of filter taps, each set of filter taps receiving a corresponding one of the input signal, and in which each tap is implemented using multiple unit charge storage cells in similar manner.

A multi input/output filter is useful for many applications, including systems with multiphase inputs, such as complex analog baseband signal filters for communication systems and the like. The generalized filter 400 has X inputs and Y outputs, and the voltage of the $j^{th}$ output is expressed by the following equation (3):

$$V_{o,j}[k] = \sum_{q=1}^{X} \left[ \sum_{m=1}^{} \alpha_{m,j} \cdot V_{i,q}[k-m] \right] \quad (3)$$

in which "m" is an index value ranging from 1 to a length value indicative of the tap having the longest length.

Figure 5A:
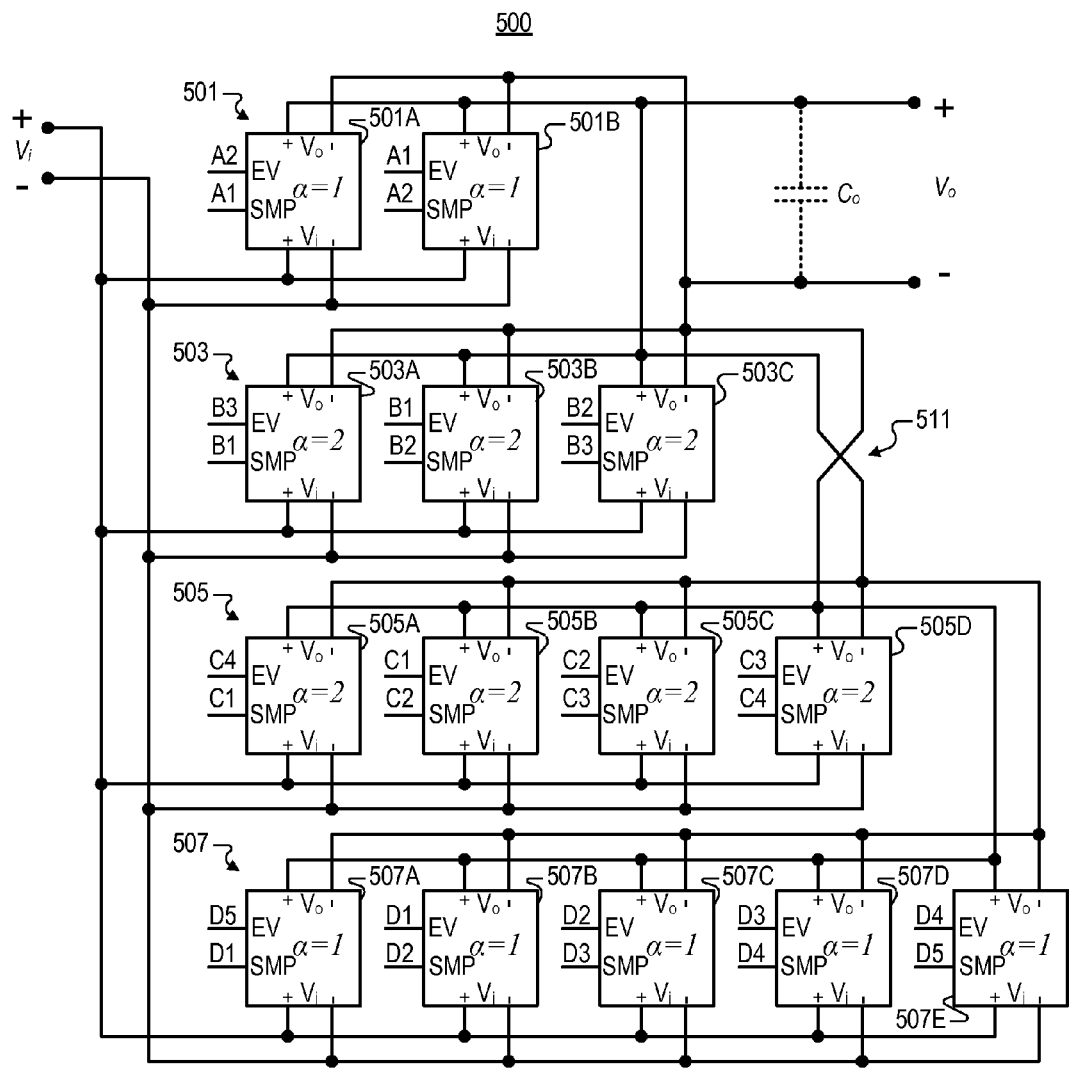
FIG. 5A is a schematic and block diagram of a 4-tap filter using unit charge storage cells that are based on the cell of FIG. 2A.

FIG. 5A is a schematic and block diagram of a 4-tap filter 500 using unit charge storage cells that are based on the cell 201. The filter 500 includes four taps 501 (TAP1), 503 (TAP2), 505 (TAP3) and 507 (TAP4), in which the first tap 501 includes unit charge storage cells 501A and 501B and provides a one-clock delay, the second tap 503 includes unit charge storage cells 503A, 503B and 503C and provides a two-clock delay, the third tap 505 includes unit charge storage cells 505A, 505B, 505C and 505D and provides a three-clock delay, and the fourth tap 507 includes unit charge storage cells 507A, 507B, 507C, 507D and 507E and provides a four-clock delay. In one embodiment, each of the unit charge storage cells 501A-B, 503A-C, 505A-D and 507A-E is configured in substantially the same manner as the unit charge storage cell 201 with a corresponding weight factor. The unit charge storage cells 501A-B of the first tap 501 each have a relative weight of $\alpha=1$, the unit charge storage cells 503A-C of the second tap 503 each have a relative weight of $\alpha=2$, the unit charge storage cells 505A-D of the third tap 505 each have a relative weight of $\alpha=2$, and the unit charge storage cells 507A-B of the fourth tap 507 each have a relative weight of $\alpha=1$.

The positive input polarity of each of the unit charge storage cells of the filter 500 is coupled to the positive polarity of the input signal $V_i$ ($V_i+$), and the negative input polarity of each of the unit charge storage cells of the filter 500 is coupled to the negative polarity of the input signal $V_i$ ($V_i-$). For the filter 500, feed-forward paths of the first 2 taps 501 and 503 have positive coefficients while the last two taps 505 and 507 have negative coefficients. The positive output polarity of each of the unit charge storage cells 501A-B and 503A-C of the taps 501 and 503 are each coupled to the positive polarity of the output signal $V_o$ ($V_o+$), and the negative output polarity of each of the unit charge storage cells 501A-B and 503A-C of the taps 501 and 503 are each coupled to the negative polarity of the output signal $V_o$ ($V_o-$). However, since each delay path samples the input voltage with a common polarity, the polarity of the output connection is reversed for the last two paths, as indicated by crossover paths 511 to effectuate negative coefficients. As shown, the reversal of polarity for the output connection is achieved by reversing the output polarity of the cells to the output signal $V_o$ using the crossover paths 511 as they pass between the second and third feed-forward paths of the filter 500. Thus, the positive output polarity of each of the unit charge storage cells 505A-D and 507A-E of the taps 505 and 507 are each coupled to the negative polarity of the output signal $V_o$ ($V_o-$), and the negative output polarity of each of the unit charge storage cells 505A-D and 507A-E of the taps 505 and 507 are each coupled to the positive polarity of the output signal $V_o$ ($V_o+$).

The unit charge storage cells 501A-B of the first tap 501 receive two timing signals A1 and A2, in which the timing signals are reversed between the control inputs of the individual cells. The unit charge storage cells 503A-C of the second tap 503 receive three timing signals B1, B2 and B3, in which the timing signal connections are rotated among the control inputs of the individual cells as shown. In a similar manner, the unit charge storage cells 505A-D of the third tap 505 receive four timing signals C1, C2, C3 and C4, in which the timing signal connections are rotated among the control inputs of the individual cells as shown, and the unit charge storage cells 507A-E of the fourth tap 507 receive five timing signals D1, D2, D3, D4 and D5, in which the timing signal connections are rotated among the control inputs of the individual cells as shown.

Figure 5B:
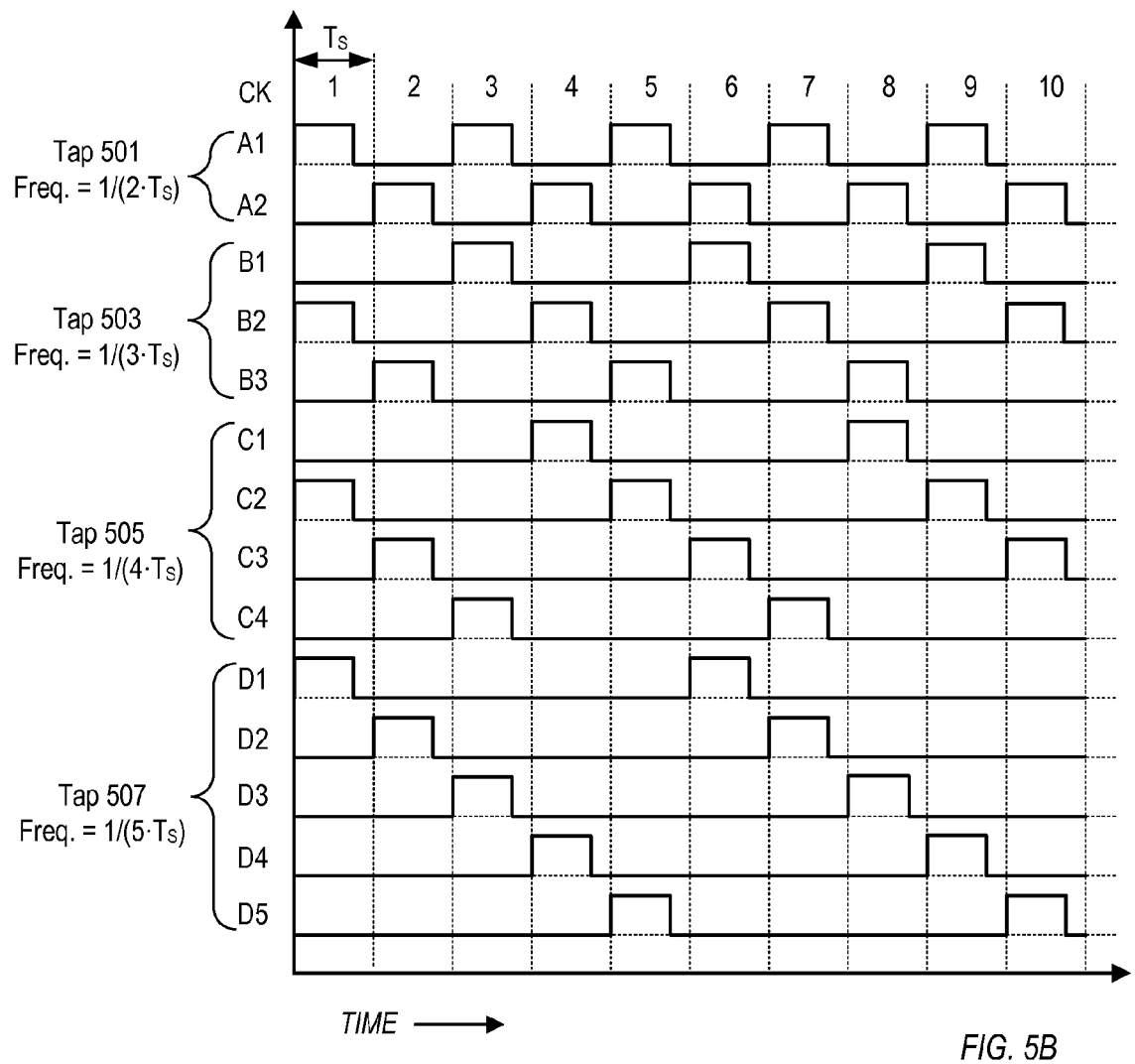
FIG. 5B is a corresponding timing diagram and FIG. 5C is a plot of the corresponding impulse response.

FIG. 5B is a timing diagram plotting the timing signals A1-A2, B1-B3, C1-C4 and D1-D5 versus time, with a clock signal CK shown at top with sampling time period $T_S$. $T_S$ represents the overall sampling period of filter 500. However, in the exemplary timing diagram of FIG. 5B, individual storage cells labeled 501A-507E sample the input signal at a plurality sampling frequencies, related to $T_S$: storage cells 501A-B sample the input signal with a period of $2 \cdot T_S$, storage cells 503A-C sample the input signal with a period of $3 \cdot T_S$, storage cells 505A-D sample the input signal with a period of $4 \cdot T_S$, and storage cells 507A-E sample the input signal with a period of $5 \cdot T_S$. Within a given tap of filter 500, the constituent storage cells sample the input signal at multiple non-overlapping phases of a common sampling frequency. The output voltage for the filter 500, excluding an output capacitor, using the timing signals shown in FIG. 5B, may be expressed according to the following equation (4):

$$V_o[k] = \frac{\alpha_1 \cdot V_i[k-1] + \alpha_2 \cdot V_i[k-2] - \alpha_3 \cdot V_i[k-3] - \alpha_4 \cdot V_i[k-4]}{\alpha_1 + \alpha_2 + \alpha_3 + \alpha_4} \quad (4)$$

An output capacitor $C_o$ may be provided at the output as shown in dashed lines. If the output capacitor $C_o$ is connected to the output, then the output voltage $V_o$ depends not only on the feed-forward paths from the input, but on the previous value of the output as well. As a result, output capacitor $C_o$ may cause the filter 500 to have an infinite impulse response (IIR). The effect of this output capacitor $C_o$ is strongly dependent on its value relative to the unitary capacitance value $C_S$ of the sampling capacitors, and it may be increased as desired to enhance the overall filter response. The input/output relationship is according to the following equation (5) for the case in which $C_o = N \cdot C_S$:

$$V_o[k] = \frac{\alpha_1 \cdot V_i[k-1] + \alpha_2 \cdot V_i[k-2] - \alpha_3 \cdot V_i[k-3] - \alpha_4 \cdot V_i[k-4] + N \cdot V_o[k-1]}{\alpha_1 + \alpha_2 + \alpha_3 + \alpha_4 + N} \text{ for } C_o = N \cdot C_S \quad (5)$$

Figure 5C:
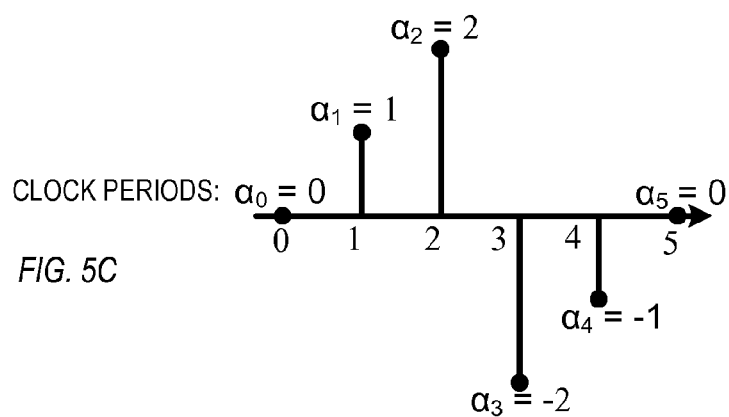

FIG. 5C is a plot of the corresponding impulse response of the filter 500, assuming the value of output capacitor $C_o$ is negligible. The first value at clock period 1 is positive having a weight magnitude of $\alpha_1=1$, the second value at clock period 2 is positive having a weight magnitude of $\alpha_2=2$, the third value at clock period 3 is negative having a weight magnitude of $\alpha_3=-2$, and the fourth value at clock period 4 is negative having a weight magnitude of $\alpha_4=-1$. The impulse response further shows clock periods 0 and 5 having a weight magnitude of $\alpha_3=0$.

Figure 6A:
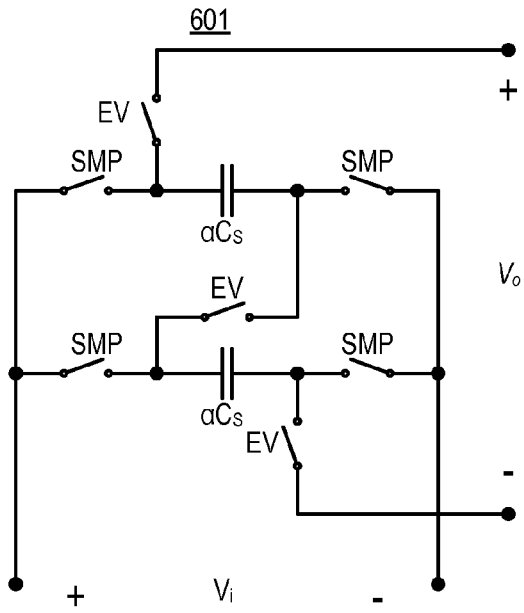
FIG. 6A is a schematic diagram of an exemplary charge storage cell implemented according to one embodiment similar to the unit charge storage cell of FIG. 2A except having a gain of 2.

FIG. 6A is a schematic diagram of an exemplary charge storage cell 601 implemented according to one embodiment similar to the unit charge storage cell 201 except having a voltage gain of 2. Each of the switches are shown as a SPST switch, similar to that shown in the cell 201, and is labeled and controlled by a corresponding one of the timing signals EV and SMP. The charge storage cell 601 includes two capacitors each having a capacitance value shown as $\alpha C_S$. In this case, when SMP is asserted high and EV is asserted low during the sample phase, the SMP switches are closed and the EV switches are opened so that the input voltage $V_i$ is applied across both of the capacitors coupled in parallel. When SMP is asserted low and EV is asserted high during the evaluation phase, the SMP switches are opened and the EV switches are closed so that the capacitors are coupled in series between the polarities of the output signal $V_o$. In this manner, the voltage sampled at the input $V_i$ is doubled and applied to the output $V_o$. The charge storage cell 601 achieves voltage gain due to charge conservation on the sampling capacitors. The voltage delivered to the output is amplified relative to the input because the capacitors present a lower total capacitance during the evaluation phase yet they have conserved the charge captured from the input (i.e., $V=Q/C$).

The 4-tap filter 500, when using the unit charge storage cells 201, does not provide voltage gain. However, the 4-tap filter 500, when using the charge storage cells 601 instead (thus using the cells 601 for each of the cells in taps 501, 503, 505 and 507), provides a new input/output voltage relationship according to the following equation (6):

$$V_o[k] = \frac{\alpha_1 \cdot V_i[k-1] + \alpha_2 \cdot V_i[k-2] - \alpha_3 \cdot V_i[k-3] - \alpha_4 \cdot V_i[k-4] + N \cdot V_o[k-1]}{\frac{\alpha_1 + \alpha_2 + \alpha_3 + \alpha_4}{2} + N} \text{ for } C_o = N \cdot C_S \quad (6)$$

If N=0, then $V_o[k]$ is simply twice as large when the cells 601 are used as compared to the cells 201. The apparent voltage gain is reflected by the change in the denominator of as shown in equation (6). Due to the division by a factor of 2, the overall input/output relationship is more sensitive to capacitance present at the output terminals.

Figure 6B:
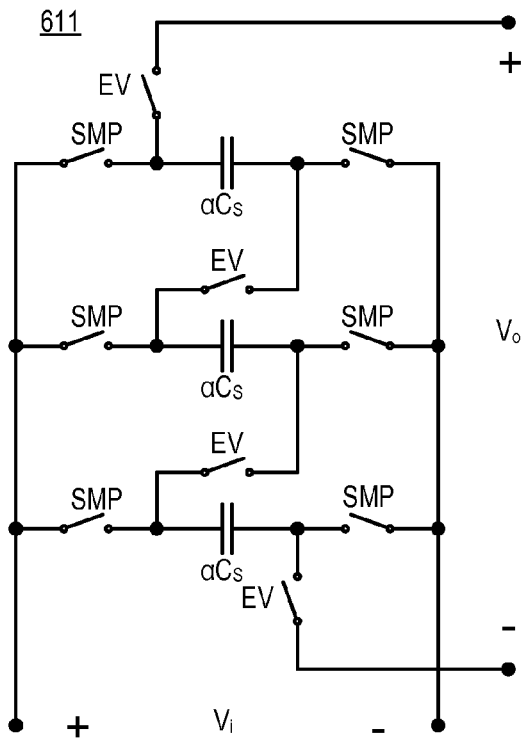
FIG. 6B is a similar cell except having a gain of 3.

FIG. 6B is a schematic diagram of an exemplary charge storage cell 611 implemented according to one embodiment similar to the charge storage cell 601 except having a gain of 3. The configuration of the cell 611 is similar to that of 601 except including a third capacitor and corresponding EV and SMP switches. During the sample phase when SMP is asserted high and the SMP switches are closed, the input voltage $V_i$ is applied across the capacitors coupled in parallel. During the evaluation phase when EV is asserted high and the EV switches are closed, the capacitors are switched to a series coupled configuration between the polarities of the output signal $V_o$ to provide a voltage gain of 3.

Figure 6C:
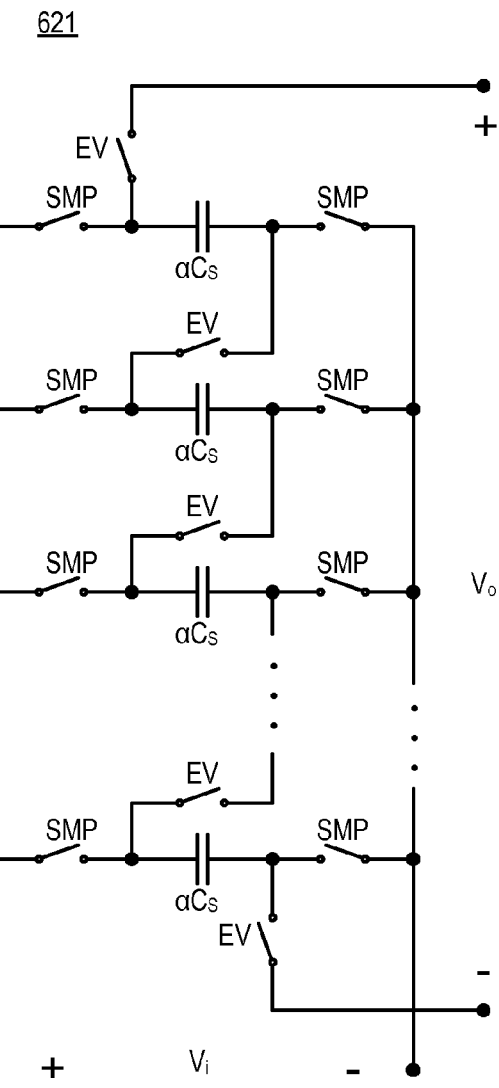
FIG. 6C is a similar cell except having a gain of an integer number P.

FIG. 6C is a schematic diagram of an exemplary charge storage cell 621 implemented according to one embodiment similar to the charge storage cells 601 and 611 except having a gain of an integer number P (1 or more). The configuration of the cell 621 is similar to that of 611 except including a total of P capacitors and corresponding EV and SMP switches. During the sample phase when SMP is asserted high and the SMP switches are closed, the input voltage $V_i$ is applied across each of the P capacitors coupled in parallel. During the evaluation phase when EV is asserted high and the EV switches are closed, the P capacitors are switched to a series coupled configuration between the polarities of the output signal $V_o$ to provide a voltage gain of P. It is noted that P may be any suitable number to achieve a suitable voltage gain.

FIG. 7A is a schematic diagram of an exemplary programmable charge storage cell 701 implemented according to another embodiment with programmable voltage gain. FIG. 7B is a corresponding circuit symbol representing the programmable charge storage cell 701. The programmable charge storage cell 701 includes a pair of $\alpha C_S$ capacitors and SMP and EV switches configured as shown and controlled by corresponding SMP and EV control signals. The programmable charge storage cell 701 further includes switches EV1 and EV2 controlled by corresponding control signals EV1 and EV2, respectively. Furthermore, the programmable charge storage cell 701 includes a multiplexer (MUX) 703 having a control input receiving timing signal EV, a select input receiving a select signal G, and a pair of outputs providing the timing signals EV1 and EV2.

In operation, the EV1 and EV2 signals are both normally low unless otherwise controlled by EV depending upon the value of G. When G is low, EV1 is selected and follows the state of EV while EV2 remains asserted low (and the corresponding EV2 switches remain opened). When G is high, EV2 is selected and follows the state of EV while EV1 remains asserted low (and the corresponding EV1 switches remain opened). For simplicity, the unit charge storage cell 701 includes just two programmable gain options, 1 V/V (Volts/Volt) or 2 V/V, depending on the value of the input signal G. The evaluation signal EV is multiplexed and the output of the MUX 703 (or decoder) either activates the switches labeled and controlled by EV1 or those labeled and controlled by EV2, depending on the value of G. When G is high selecting EV2, the unit charge storage cell 701 is functionally equivalent to unit charge storage cell 601 with a gain of 2. When G is low, then both sampling capacitors connect to the output in parallel during evaluation, making the programmable charge storage cell 701 functionally equivalent to unit charge storage cell 201, with the exception that the weighting factor is $2\alpha$. However, if a complete filter, such as the filter 500, for example, is constructed using the programmable gain unit cell 701, and the G terminal of all cells are controlled by a single input signal, then the relative weight of each tap remains constant, independent of G. Thus, the G input changes the gain of the filter, but does not otherwise change the transfer function, provided $C_o$ is negligible.

Capacitive stacking at the level of the unit cell, as illustrated by the cells 601, 611 and 621 and discussed above, is an effective method for achieving passive voltage gain. Capacitive stacking, however, uses more individual capacitors and switches as compared to the simple unit cell 201, thus implying a larger area implementation with higher routing complexity and parasitics, especially as the number of taps is increased. Furthermore, each of the additional switches are dynamically enabled/disabled, resulting in additional power consumption.

An alternative method for achieving voltage gain that overcomes the disadvantages described for the cells 601, 611 and 621 is illustrated by the configuration shown in FIGS. 8A and 8B.

FIG. 8A is a simplified block diagram of a 4-tap filter 800 according to one embodiment which implements the impulse response shown in FIG. 5C and may achieve twice the voltage gain of filter 500 by connecting tap outputs in series. The filter 800 includes 4 taps 801, 803, 805 and 807, each having differential input terminals coupled to the corresponding polarities of the input signal $V_i$. The first two taps 801 and 803 each have a positive output polarity coupled to the positive output polarity $V_o+$, and the second two taps 805 and 807 each have a positive output polarity coupled to the negative output polarity $V_o-$. The negative output polarity of tap 801 (TAP1) is coupled to the negative output polarity of tap 807 (TAP4) at a node 802, and the negative output polarity of tap 803 (TAP2) is coupled to the negative output polarity of tap 805 (TAP3) at a node 804.

FIG. 8B is a simplified block diagram of the 4-tap filter 800 according to a more specific embodiment. In one embodiment, each of the taps 801-807 are implemented using the unit charge storage cell 201. The first tap 801 includes two unit charge storage cells 201 each having a weight factor $\alpha_1$, each having its positive and negative inputs coupled to the positive and negative polarities, respectively, of the input signal $V_i$, each having its positive output terminal coupled to the positive polarity of the output signal $V_o$, and each having its negative output terminal coupled to node 802. The two unit charge storage cells 201 of the first tap 801 are collectively controlled by timing signals A1 and A2 in a similar manner as previously described. The second tap 803 includes three unit charge storage cells 201 each having a weight factor of $\alpha_2$, each having its positive and negative inputs coupled to the positive and negative polarities, respectively, of the input signal $V_i$, each having its positive output terminal coupled to the positive polarity of the output signal $V_o$, and each having its negative output terminal coupled to node 804. The three unit charge storage cells 201 of the tap 803 are collectively controlled by timing signals B1-B3 in a similar manner as previously described. The third tap 805 includes four unit charge storage cells 201 each having a weight factor of $\alpha_3$, each having its positive and negative inputs coupled to the positive and negative polarities, respectively, of the input signal $V_i$, each having its positive output terminal coupled to the negative polarity of the output signal $V_o$, and each having its negative output terminal coupled to node 804. The four unit charge storage cells 201 of the tap 805 are collectively controlled by timing signals C1-C4 in a similar manner as previously described. The fourth tap 807 includes five unit charge storage cells 201 each having a weight factor of $\alpha_4$, each having its positive and negative inputs coupled to the positive and negative polarities, respectively, of the input signal $V_i$, each having its positive output terminal coupled to the negative polarity of the output signal $V_o$, and each having its negative output terminal coupled to node 802. The five unit charge storage cells 201 of the tap 807 are collectively controlled by timing signals D1-D5 in a similar manner as previously described.

Voltage gain for the filter 800 is achieved at a higher level in the filter hierarchy; gain is accomplished by connecting in series the outputs of feed-forward taps having tap weights of equal magnitude. Hence, for the 4-tap filter 800, the output terminals of taps 1 and 4 are connected in series as are the outputs of taps 2 and 3, creating two tap groups t_23 and t_14. Note that these series connections simply affect a voltage summation and do not incur charge sharing because a closed circuit is not formed. However, the outputs of t_23 and t_14 are connected in parallel, thus forming a closed circuit to allow for charge sharing. This method is easily applied to any filter with symmetric or anti-symmetric taps to achieve a gain of 2 V/V. Furthermore, this method may be used in conjunction with capacitive stacking at the unit cell level to achieve higher voltage gain.

The input/output voltage relationship for the filter 800, assuming the use of the storage cells 201, is expressed according to the following equation (7):

$$V_o[k] = \frac{\frac{\alpha_1 \cdot \alpha_4}{\alpha_1 + \alpha_4} \cdot (V_i[k-1] - V_i[k-4]) + \frac{\alpha_2 \cdot \alpha_3}{\alpha_2 + \alpha_3} \cdot (V_i[k-2] - V_i[k-3])}{\frac{\alpha_1 \cdot \alpha_4}{\alpha_1 + \alpha_4} + \frac{\alpha_2 \cdot \alpha_3}{\alpha_2 + \alpha_3}} \quad (7)$$

From equation (7) it is clear that the output voltages of two taps connected in series are multiplied by the same weighting factor in the numerator and thus, both sampled voltages contribute equally to the filter output voltage. However, the polarity of the series voltages may be positive or negative. Hence, any taps having tap weights of equal magnitude may be connected in series. Then, assuming $\alpha_1=\alpha_4$ and $\alpha_2=\alpha_3$, $V_o[k]$ in equation (7) reduces to twice the value in equation (4).

The series connection of tap outputs to provide voltage gain via has advantages over capacitive stacking at the unit storage cell level, mostly because of reduced complexity and fewer dynamic switches. An additional advantage is the relative simplicity with which voltage gain can be made programmable as illustrated in FIGS. 9A and 9B.

Figure 9A:
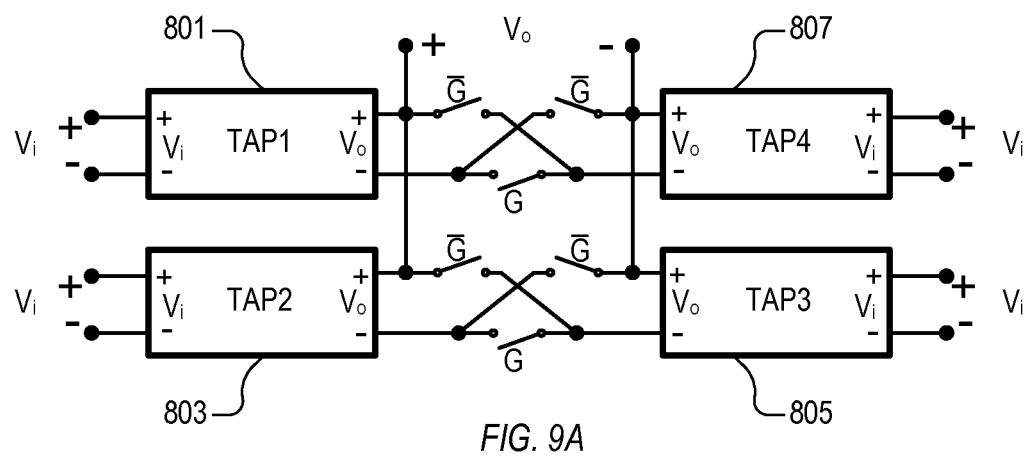
FIG. 9A is a simplified block diagram of a programmable 4-tap filter similar to the filter of FIG. 8A and including additional switches for programmability.
Figure 9B:
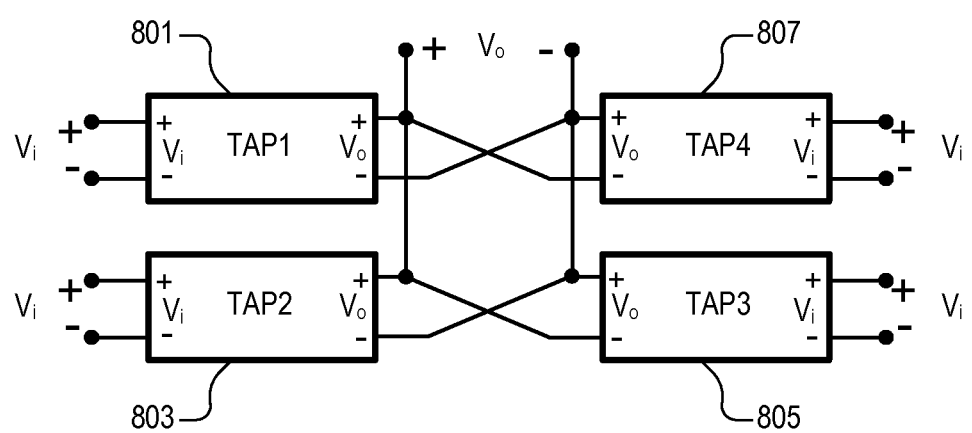
FIG. 9B shows the filter programmed with a gain of 1 V/V.
Figure 10A:
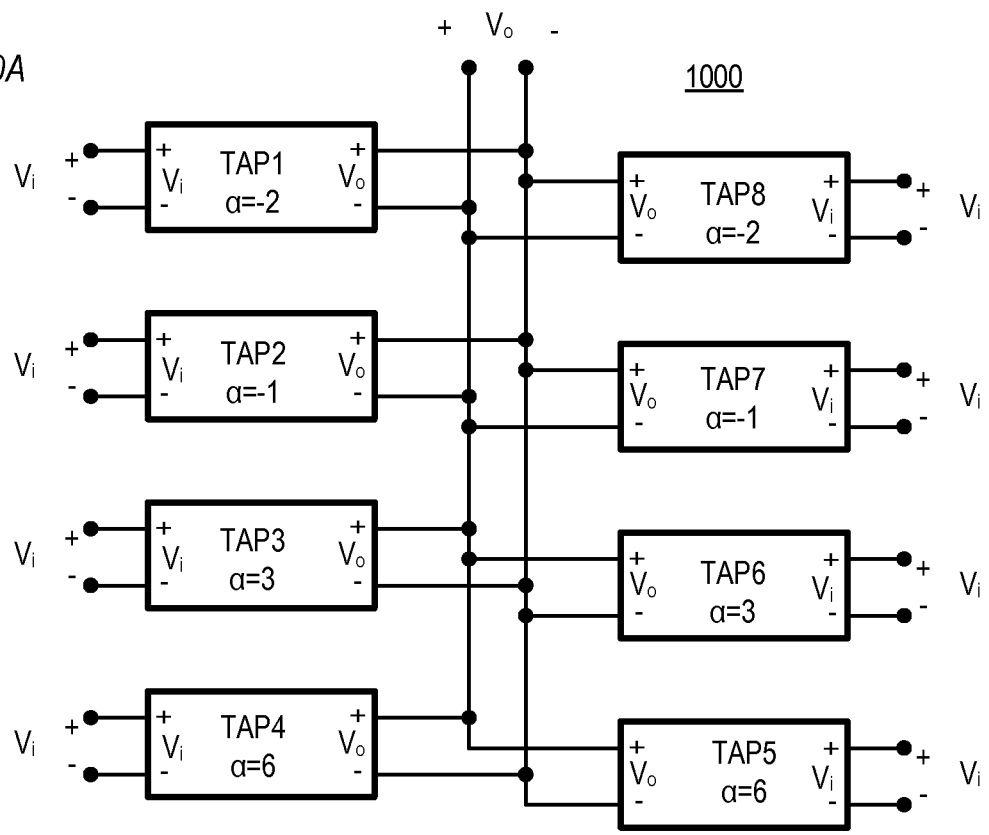
FIGS. 10A-10D are block diagrams of symmetric 8-tap lowpass filters and FIGS. 11A-11D are plots of the corresponding impulse responses.
Figure 10B:
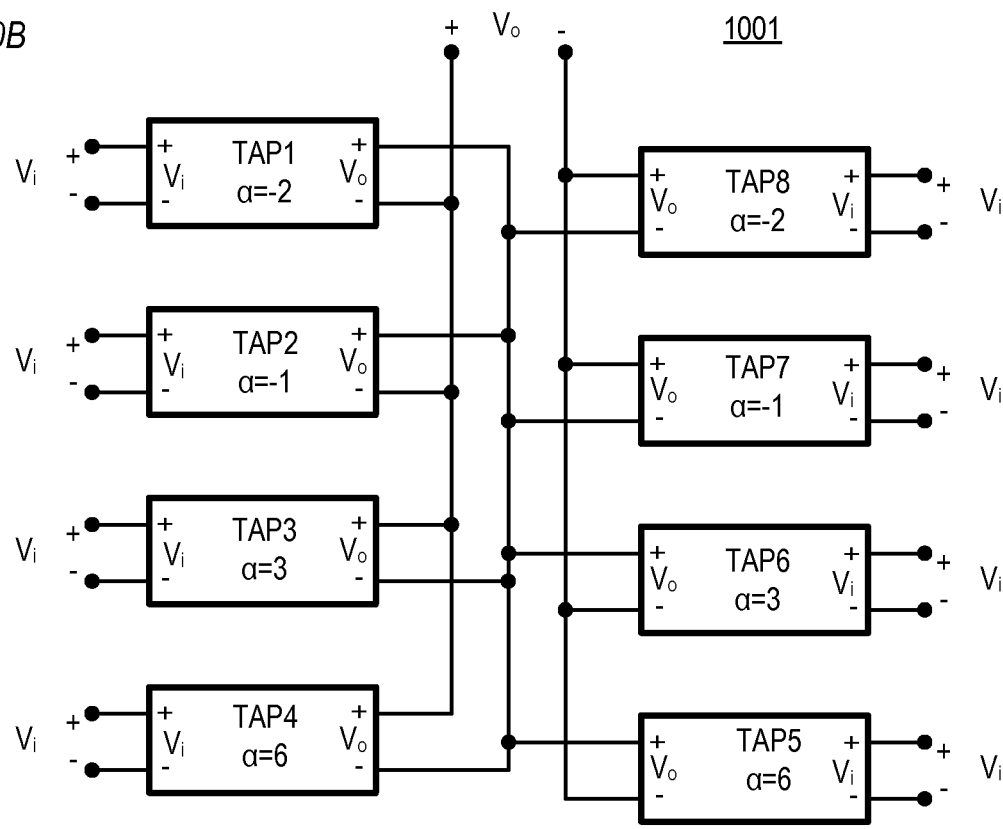
Figure 10C:
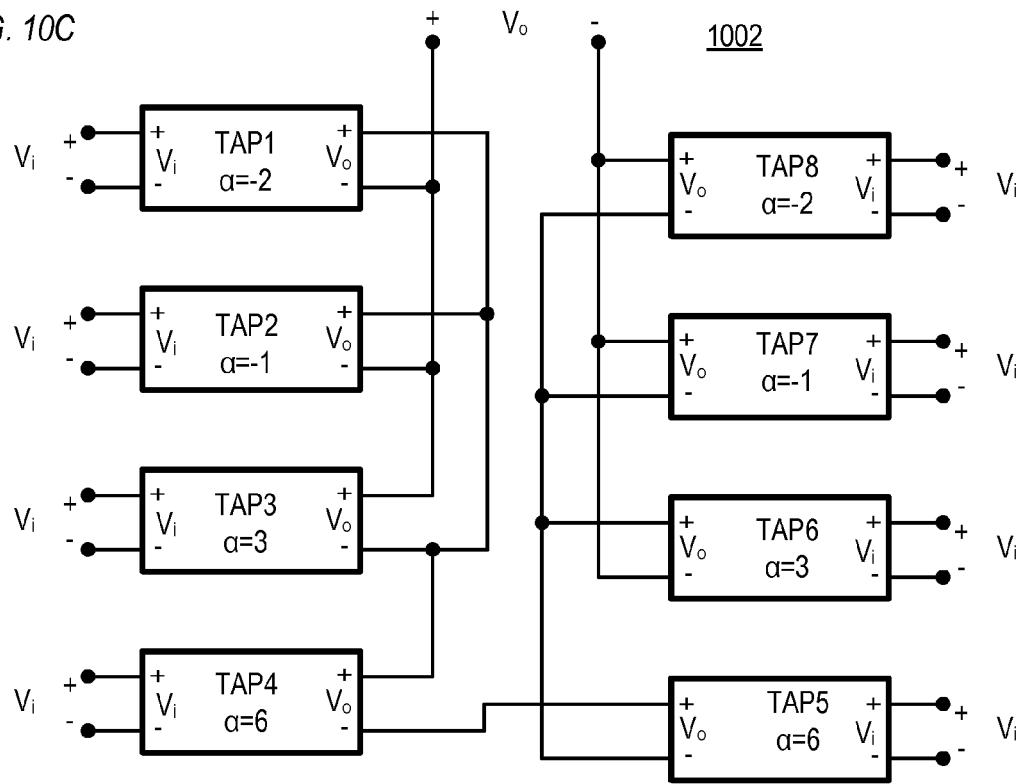
Figure 10D:
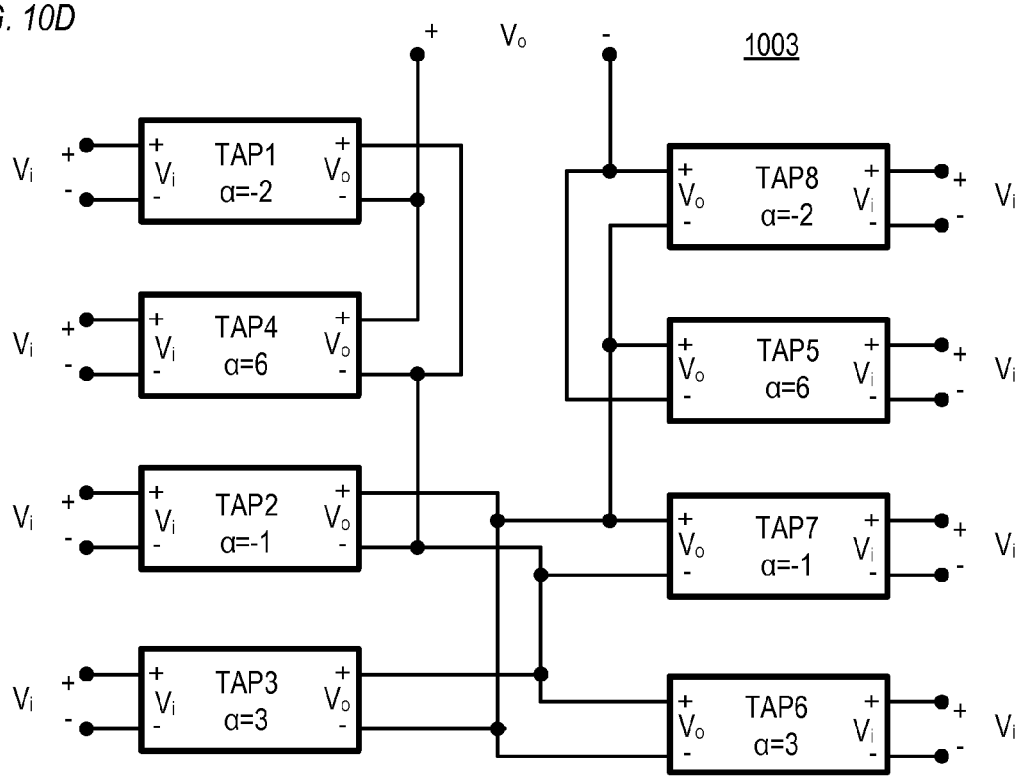
Figure 11A:
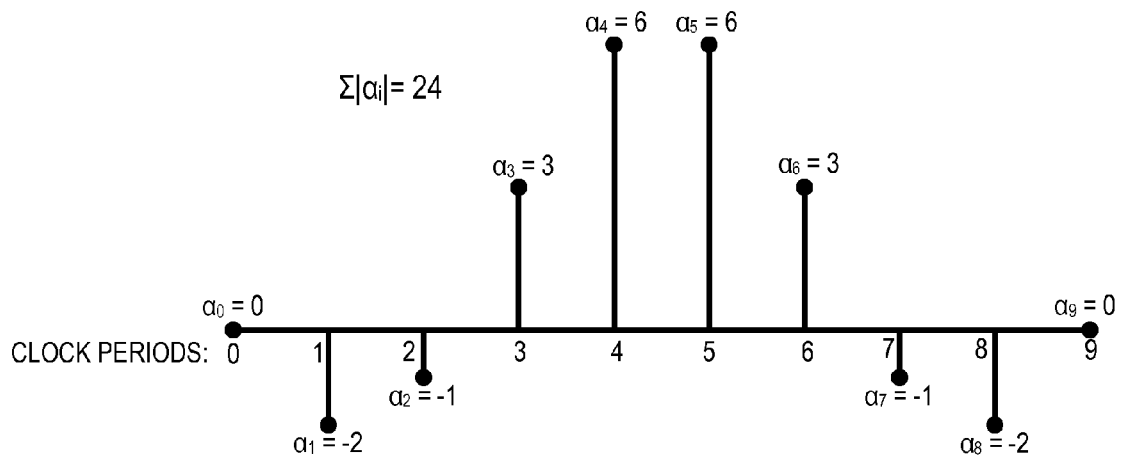
Figure 11B:
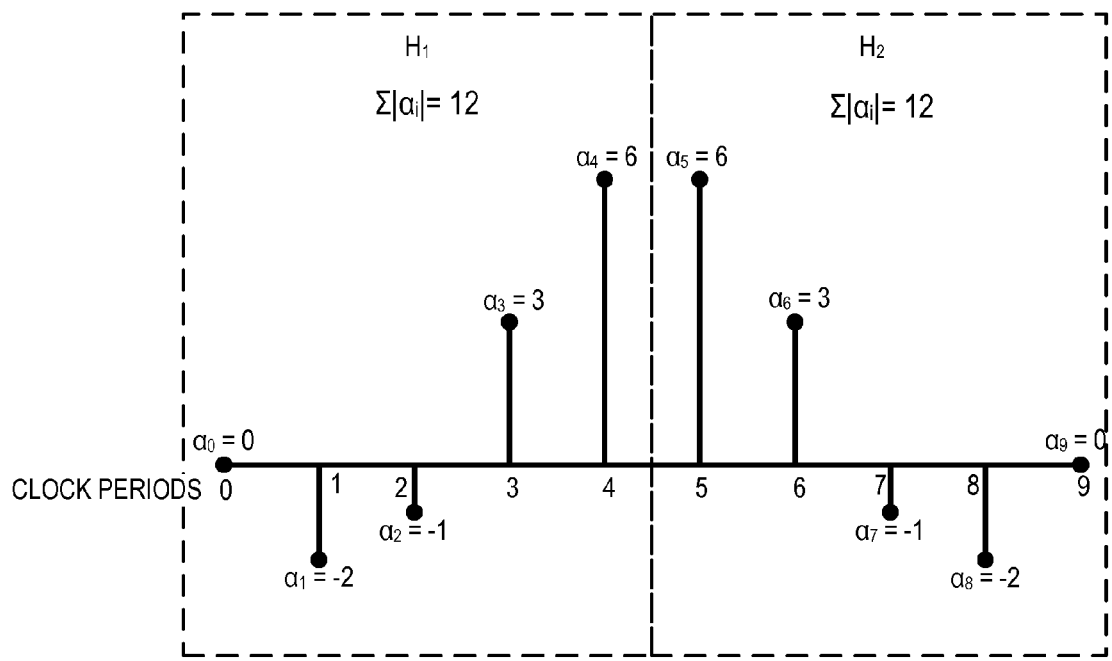
Figure 11C:
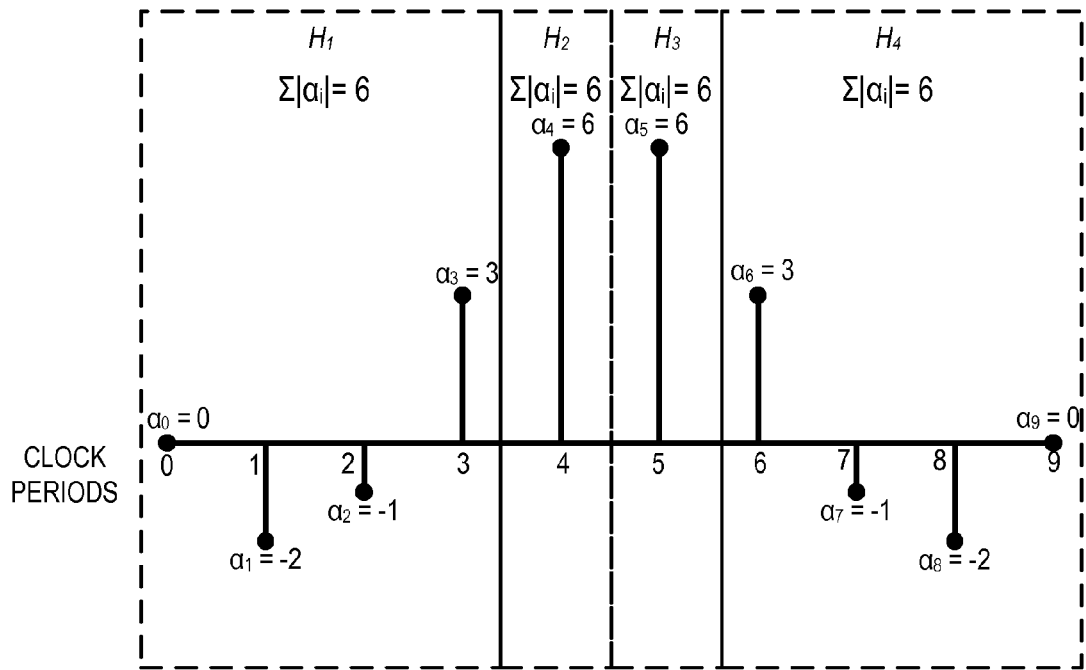
Figure 11D:
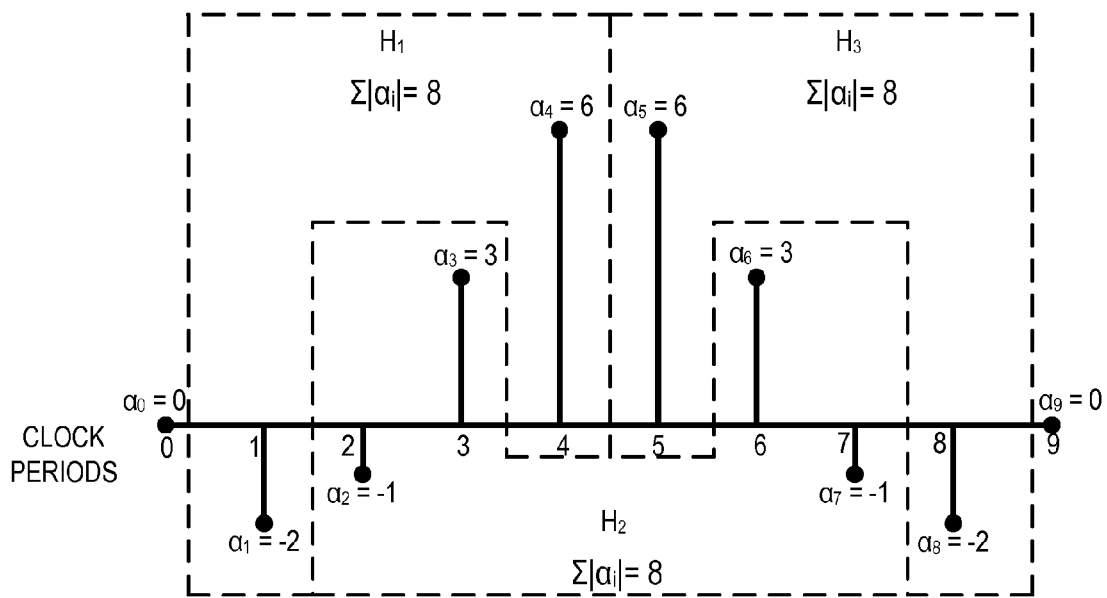

FIG. 9A is a simplified block diagram of a programmable 4-tap filter 900 similar to the filter 800 and including additional switches for programmability. In particular, the four taps 801-807 (taps 1-4 shown as TAP1, TAP2, TAP3, TAP4) are included and configured in substantially similar manner with each coupled to the input $V_i$ in the same manner. The positive output terminals of each of the taps 1-4 are coupled in the same manner, where the positive output terminals of taps 1 and 2 are coupled to the positive polarity of the output voltage, $V_o+$, and where the positive output terminals of taps 3 and 4 are coupled to the negative polarity of the output voltage, $V_o-$. A set of SPST switches, each labeled with a gain control signal G or $\overline{G}$ for controlling the corresponding switch, are provided between the positive and negative output terminals of the taps 1-4. As shown, a first switch is coupled between $V_o-$ of TAP1 and $V_o-$ of TAP4 and controlled by G, a second switch is coupled between $V_o+$ of TAP1 and $V_o-$ of TAP4 and controlled by $\overline{G}$, a third switch is coupled between $V_o-$ of TAP1 and $V_o+$ of TAP4 and controlled by $\overline{G}$, a fourth switch is coupled between $V_o-$ of TAP2 and $V_o-$ of TAP3 and controlled by G, a fifth switch is coupled between $V_o+$ of TAP2 and $V_o-$ of TAP3 and controlled by $\overline{G}$, and a sixth switch is coupled between $V_o-$ of TAP2 and $V_o+$ of TAP3 and controlled by $\overline{G}$. G and $\overline{G}$ are inverted with respect to each other so that when G is high, $\overline{G}$ is low and vice-versa. Also, when its control signal is asserted high, the corresponding switch is closed, and when asserted low, the switch is opened.

When G is high and $\overline{G}$ is low, the 4-tap filter 900 has the same form as the 4-tap filter 800 previously described having a gain Av=2 V/V. When G is low and $\overline{G}$ is high, the 4-tap filter 900 assumes the configuration of a 4-tap filter 910 as shown in FIG. 9B with a gain of Av=1 V/V. In this manner, with the addition of a few static switches, the output connections of taps 1-4 from the 4-tap filter 800 are easily reconfigured to produce a voltage gain of either 1 V/V or 2 V/V. These additional switches are static in the sense that they are not clocked during normal operation, hence they do not appreciably add to the overall power consumption of the filter.

FIGS. 10A, 10B, 10C and 10D are block diagrams of symmetric 8-tap lowpass filters 1000, 1001, 1002 and 1003, respectively. FIGS. 11A, 11B, 11C and 11D are plots of the corresponding impulse responses of the 8-tap lowpass filters 1000, 1001, 1002 and 1003, respectively. Each of the filters 1000-1003 include 8 taps individually labeled TAP1-TAP8, in which each tap has a given weight factor α and is implemented using the unit charge storage cells 201 in a similar manner as shown in FIG. 8B for the 4-tap filter 800. The input of each tap is coupled to the input signal $V_i$ in substantially the same manner as previously described. However, each filter has a different voltage gain value determined by the configuration of the tap outputs as shown. In particular, the 8-tap filter 1000 has its tap outputs coupled to provide a gain Av=1 V/$V_i$, the 8-tap filter 1001 has its taps outputs coupled to form 2 sub-filters $H_1$ and $H_2$ to collectively provide a gain Av=2 V/V, the 8-tap filter 1002 has its taps outputs coupled to form 4 sub-filters $H_1$, $H_2$, $H_3$, and $H_4$ to collectively provide a gain Av=4 V/V, and the 8-tap filter 1003 has its taps outputs coupled to form 3 sub-filters $H_1$, $H_2$, and $H_3$ to collectively provide a gain Av=3 V/V.

As illustrated by the output couplings of each filter and the corresponding impulse responses, each of the 8-tap filters 1000-1003 is divided into sub-filters ($H_i$), whose outputs are connected in series. The sub-filters are selected such that the sums of the magnitude of the taps in each sub-filter $H_i$ are equal. Hence, since the sum of the magnitude of all 8 taps is 24, then a subdivision into two filters (filter 1001) includes two sub-filters with a tapsum of 12 each, subdivision into three filters (filter 1003) includes three sub-filters each having a tapsum of 8, and so on. The relative voltage gain of the subdivided filter, as compared to the undivided filter, is equal to the number of subdivisions.

The method of coupling taps of equal magnitude in series as illustrated by the filters 1000-1003 to achieve voltage gain illustrates that voltage gain is easily made programmable with minimal additional hardware and no additional dynamic switches. Furthermore, subdividing a given filter according to output connection configurations allows for the additional flexibility to achieve many different voltage gain values, especially as the number of taps in the filter increases. The filters 1000-1003 illustrate only a few of the possible configurations for an 8-tap filter configuration. The voltage gain method of series connections of taps with equal magnitude as illustrated by the filters 800 and 900 and the voltage gain method of sub-dividing the filter as illustrated by the filters 1000-1003 may also be used in conjunction with stacking the sample cells as illustrated by the charge storage cells 601, 611 and 621 and by the programmable charge storage cell 701 to achieve yet higher gain.

In certain applications, it may be desirable to make the filter impulse response programmable. One method of programmable impulse response is based on programming the storage capacitance and output polarity associated with each of the unit cells within the filter. The unit charge storage cell 201 may be modified to program the value of the storage capacitance and to selectively further reverse the polarity of the output.

Figures 12A, 12B:
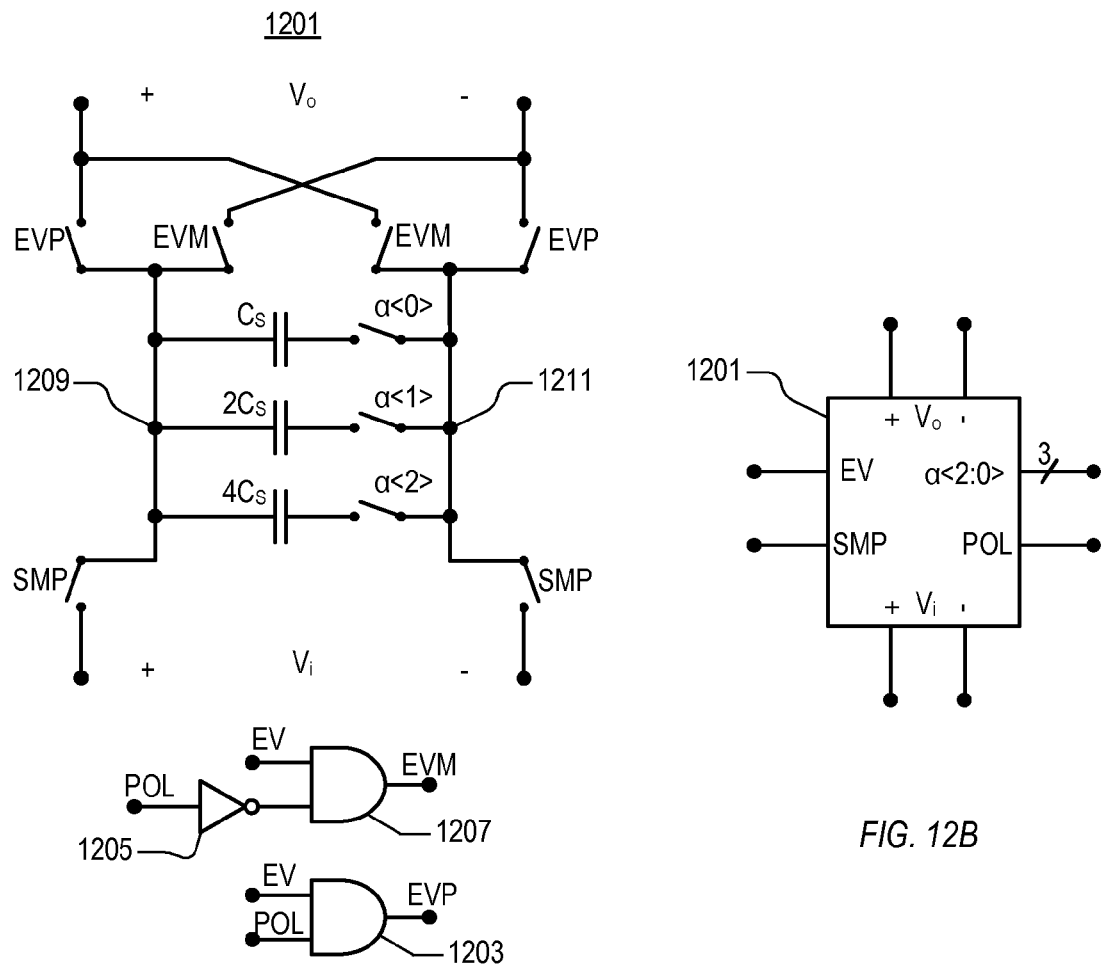
FIG. 12A is a programmable charge storage cell with a programmable coefficient according to one embodiment.
FIG. 12B shows a corresponding circuit symbol.

FIG. 12A is a programmable charge storage cell 1201 with a programmable coefficient according to one embodiment. FIG. 12B shows a corresponding circuit symbol representing the unit charge storage cell 1201. The programmable charge storage cell 1201 includes the sample and evaluation inputs EV and SMP which operate in substantially the same manner. Rather than a single sample capacitor having a one fixed weight $\alpha C_S$ provided within the unit charge storage cell 201, the programmable charge storage cell 1201 includes a set of three sample capacitors $C_S$, $2C_S$ and $4C_S$ which are individually selectable for programming the value of a binary-weighted storage capacitance from 0 to $7C_S$ in integer multiples of $C_S$. It is understood that additional sample capacitors may be included the extend the overall range of the binary-weighted storage capacitance (e.g., $8C_S$, $16C_S$, etc.). Fractional binary-weighted storage capacitors may also be included if convenient or desired (e.g., $½C_S$, $¼C_S$, etc.). A multiple bit gain input (e.g., 3-bit) α<2:0> is provided for individually selecting each sample capacitance according to the desired weight of the corresponding coefficient.

A polarity input POL determines the polarity of the sampled output relative to the input. POL and EV are provided to respective inputs of a 2-input AND gate 1203, which provides a positive evaluation signal EVP at its output. POL is provided to the input of an inverter 1205, having its output coupled to one input of another 2-input AND gate 1207, receiving EV at its other input and providing a negative evaluation signal EVM at its output. If POL is high when EV goes high, then EVP is asserted high. Otherwise, if POL is low when EV goes high, then EVM is asserted high instead for reversing polarity. The charge storage cell 1201 includes SPST switches each labeled with a corresponding one of the control signals α<2:0>, SMP, EVM and EVP for controlling the switches in a similar manner previously described. The α<2:0> input select signals collectively determine which of the sample capacitors $C_S$, $2C_S$ and $4C_S$ are selected when SMP is asserted high. A sample capacitor is selected when the select signal α<0>, α<1>, or α<2> is high and the corresponding switch is closed. Thus, the select signals control which of the sample capacitors $C_S$, $2C_S$ and $4C_S$ are coupled in parallel between nodes 1209 and 1211.

When SMP goes high, the input $V_i$ is applied across the nodes 1209 and 1211 and sampled by selected capacitors based on the binary input value when SMP is asserted high during the sample phase. When EV goes high while POL is high during the evaluation phase, then node 1209 is coupled to the positive output polarity $V_o+$ and the node 1211 is coupled to the negative output polarity $V_o-$. When EV goes high while POL is low during the evaluation phase, then the output is reversed so that node 1209 is coupled to the negative output polarity $V_o-$ and the node 1211 is coupled to the positive output polarity $V_o+$. The programmable charge storage cell 1201 provides a programmable gain magnitude from 0 to $7C_S$ with a programmable polarity for a gain range of $-7C_S$ to $+7C_S$.

Figure 13:
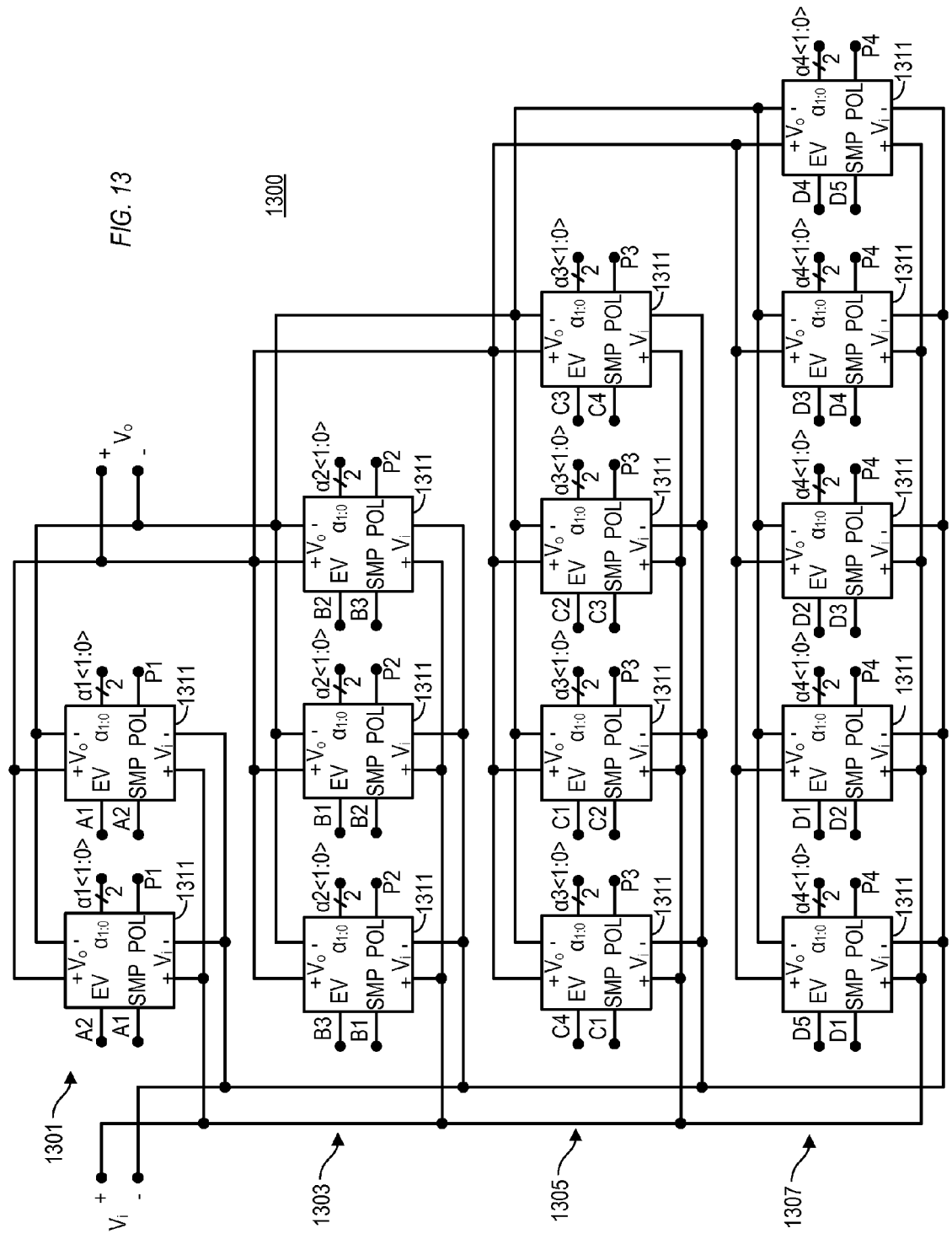
FIG. 13 is a schematic and block diagram of a 4-tap filter implemented using multiple programmable charge storage cells each substantially similar to the programmable charge storage cell of FIG. 12A.

FIG. 13 is a schematic and block diagram of a 4-tap filter 1300 implemented using multiple programmable charge storage cells 1311 each substantially similar to the programmable charge storage cell 1201. The 4-tap filter 1300 includes four taps 1301, 1303, 1305 and 1307, where the first tap 1301 has a delay of one and includes two cells 1311, the second tap 1303 has a delay of two and includes three cells 1311, the third tap 1305 has a delay of three and includes four cells 1311, and the fourth tap 1307 has a delay of four and includes five cells 1311. Each programmable charge storage cell 1311 is configured and operates in substantially similar manner as the programmable charge storage cells 1201, except that each cell 1311 only includes a 2-bit gain input for a gain range of $-3C_S$ to $+3C_S$. The cells 1311 of the first tap 1301 receive EV/SMP timing signals A1 and A2, gain inputs α1<1:0>, and polarity input P1, the cells 1311 of the second tap 1303 receive EV/SMP timing signals B1-B3, gain inputs α2<1:0>, and polarity input P2, the cells 1311 of the third tap 1305 receive EV/SMP timing signals C1-C4, gain inputs α3<1:0>, and polarity input P3, and the cells 1311 of the fourth tap 1307 receive EV/SMP timing signals D1-D5, gain inputs α4<1:0>, and polarity input P4.

The analog inputs and outputs of the cells 1311 in the filter 1300 are coupled in parallel. Hence, the tap value of each tap may be programmed independently to any integer value from −3 to +3. The total capacitance in this programmable filter implementation is $42*C_S$. The filter 1300 illustrates how tap coefficients may be programmed via a digitally controlled capacitance and programmable output routing. One issue with programming taps in this manner is that for a typical filter response, a large portion of the capacitance in the filter being unused as most taps may not be programmed to their maximum value. Hence, an integrated circuit (IC) implementation of this method may not maximize efficiency of space utilization.

FIG. 14A is a programmable charge storage cell 1401 with programmable polarity according to one embodiment. FIG. 14B shows a corresponding circuit symbol representing the unit charge storage cell 1401. The charge storage cell 1401 is a simplified version of the programmable charge storage cell 1201 including selectable polarity but with a fixed sample capacitance of $C_S$. Operation of the EV, POL, EVM, and EVP signals are substantially the same. The programmable charge storage cell 1401 excludes the gain input select signals.

Figure 15A:
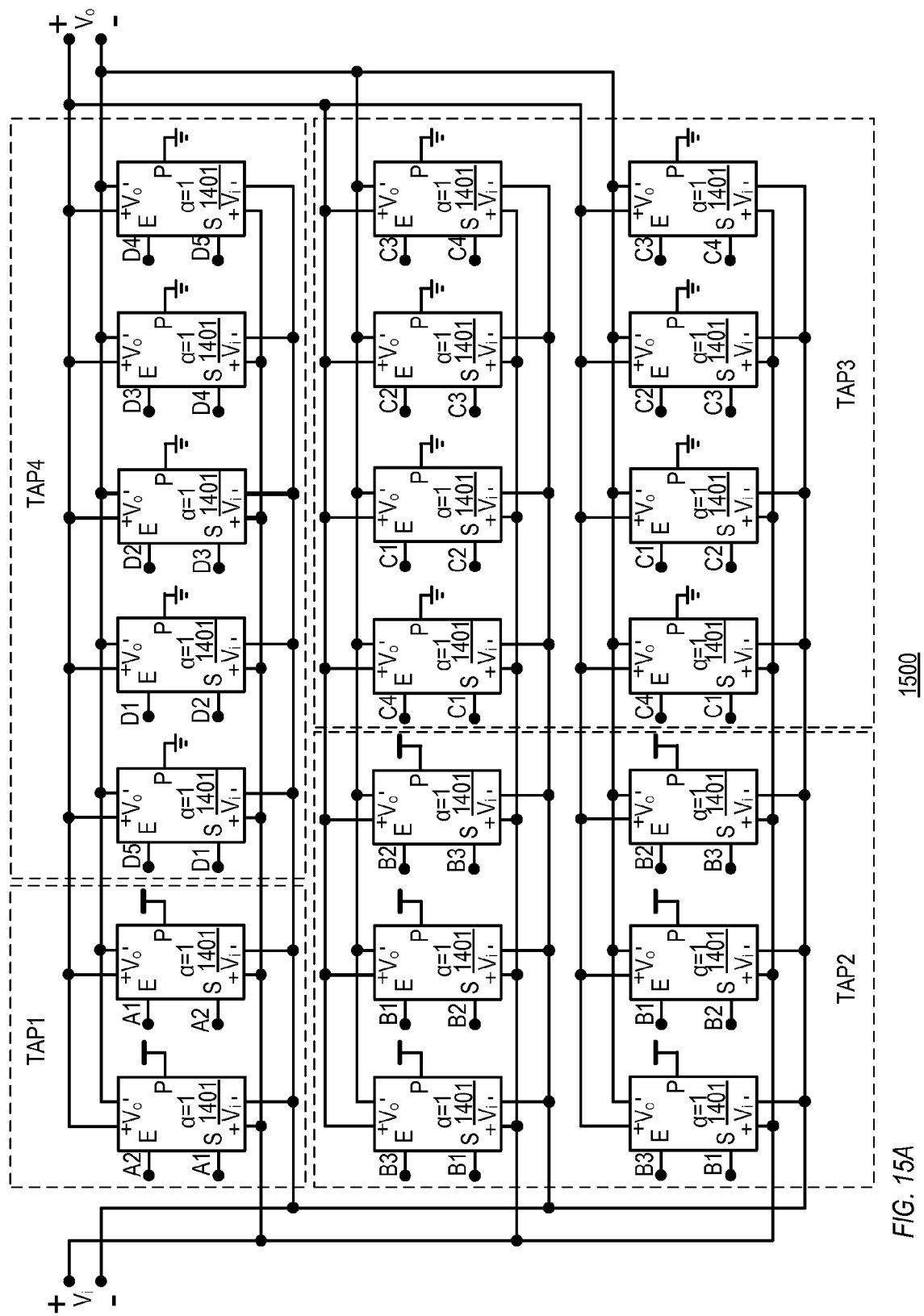
FIGS. 15A and 15B are schematic and block diagrams of 4-tap filters each implemented using a configurable 3×7 array of 21 charge storage cells of FIG. 14A.
Figure 15B:
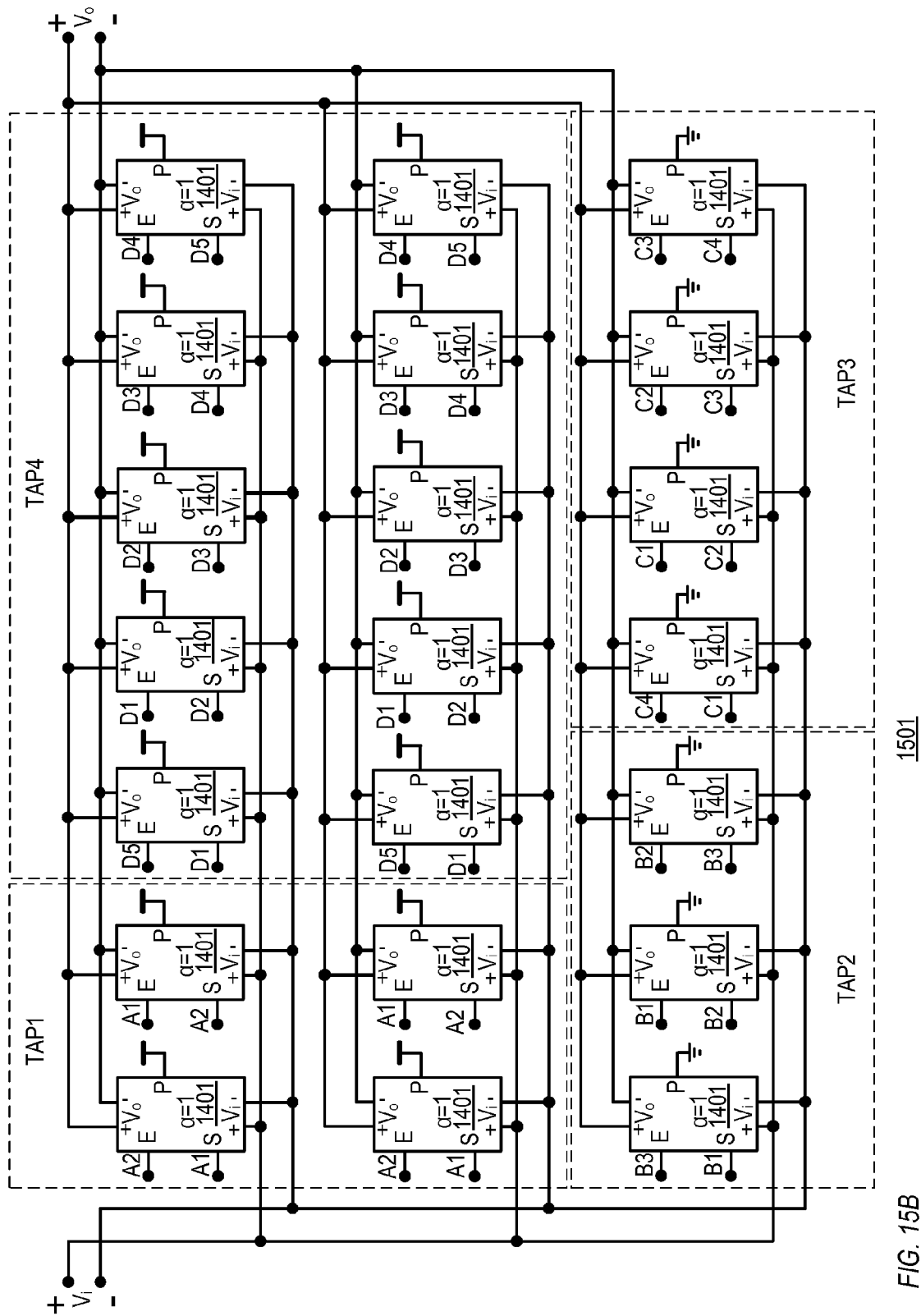
Figure 16A:
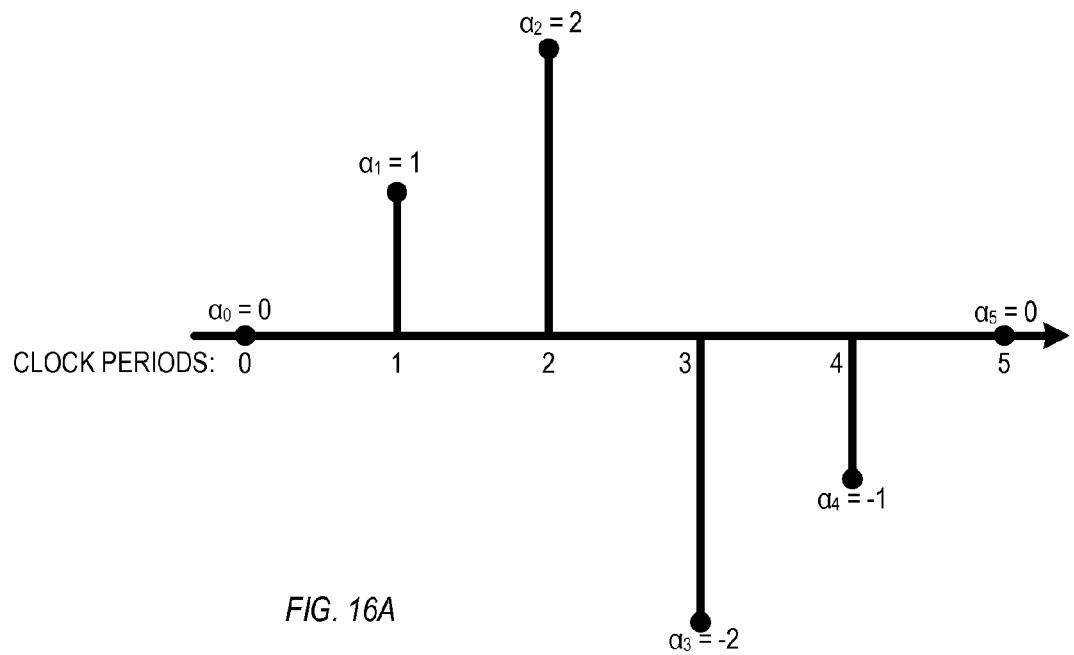
FIGS. 16A and 16B are plots of the corresponding impulse responses of the filters of FIGS. 15A and 15B, respectively.
Figure 16B:
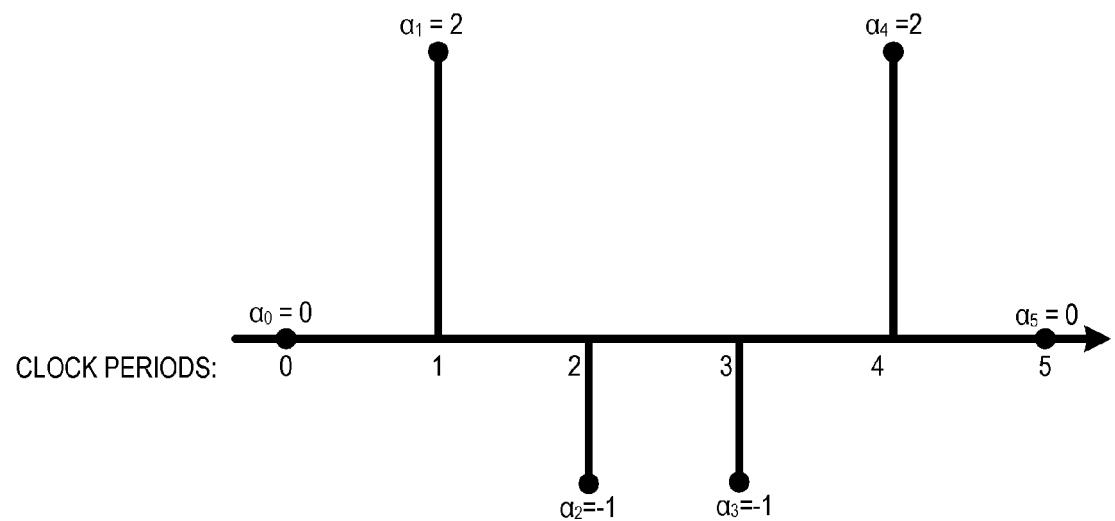

FIGS. 15A and 15B are schematic and block diagrams of 4-tap filters 1500 and 1501, respectively, each implemented using a configurable 3×7 array of 21 charge storage cells 1401. It is noted that the evaluation input is labeled E (short for EV), the sampling input is labeled S (short for SMP), and the polarity input is labeled P (short for POL). FIGS. 16A and 16B are plots of the corresponding impulse responses of the filters 1500 and 1501, respectively. Each filter 1500 and 1501 includes four taps labeled TAP1, TAP2, TAP3 and TAP4. The configurable array of charge storage cells 1401 implementing each of the 4-tap filters 1500 and 1501 illustrate how the coefficients are reconfigured by programming the output polarity of the cells and rerouting the dynamic digital timing signals (e.g., clock signals) that activate sampling and evaluation of each cell. In this case, both of the filters 1500 and 1501 use substantially the same array of storage unit cells. Hence, the total capacitance for each filter is $21*C_S$, as compared to $42*C_S$ for the filter 1300.

For the filter 1500, TAP1 includes two cells 1401 controlled by timing signals A1 and A2 and having polarity inputs pulled high (to higher voltage, such as VCC or VDD or the like), TAP2 includes six cells 1401 controlled by timing signals B1-B3 and having polarity inputs pulled high, TAP3 includes eight cells 1401 controlled by timing signals C1-C4 and having polarity inputs pulled low (to ground or GND), and TAP4 includes five cells 1401 controlled by timing signals D1-D5 and having polarity inputs pulled low.

For the filter 1501, TAP1 includes four cells 1401 controlled by the timing signals A1 and A2 and having polarity inputs pulled high, TAP2 includes three cells 1401 controlled by timing signals B1-B3 and having polarity inputs pulled low, TAP3 includes four cells 1401 controlled by timing signals C1-C4 and having polarity inputs pulled low, and TAP4 includes ten cells 1401 controlled by timing signals D1-D5 and having polarity inputs pulled high.

It is appreciated that many more variations are possible with even this simple example, yet the constraints on reconfigurability of the filter are more complex as compared to the filter 1300. The following equation (8) expresses the constraint on the filter tap weights α and delays, based on the total number of charge storage elements in the array N, where $α_i$ is a positive integer representing tap weight and i is a positive integer representing tap delay:

$$\sum_i |\alpha_i| \cdot (i+1) \le N \qquad (8)$$

It is appreciated from equation (8) that a filter configuration illustrated by filters 1500 and 1501 is not limited to a 4-tap filter but may be reconfigured into any filter configuration with any suitable number of taps satisfying equation (8). It is further noted that the filters 1300, 1500 and 1501 may be designed to incorporate variable voltage gain as previously described.

It has been illustrated how an array of unit storage cells may be formed into different filter arrangements by altering the timing of the dynamic digital signals (or clock signals) driving the SMP and EV inputs of each cell. As unit-cell arrays grow in size to support more complex filter arrangements, centralized generation and distribution of the dynamic timing signals may become impractical, even for filters with fixed coefficients.

To address this implementation challenge, a distributed approach may be used in which each unit-cell incorporates timing logic that allows it to generate its own synchronous sampling signals and coordinate with adjacent cells to form individual taps. Because the sampling and output evaluation of each storage cell is synchronized for proper charge recombination, it may be desired to distribute a master clock to the cells in the array. Then, based on the period of the master clock and the logic states of adjacent cells, each storage cell can determine the proper time sample the input voltage and connect its storage capacitor to its output port.

Figure 17:
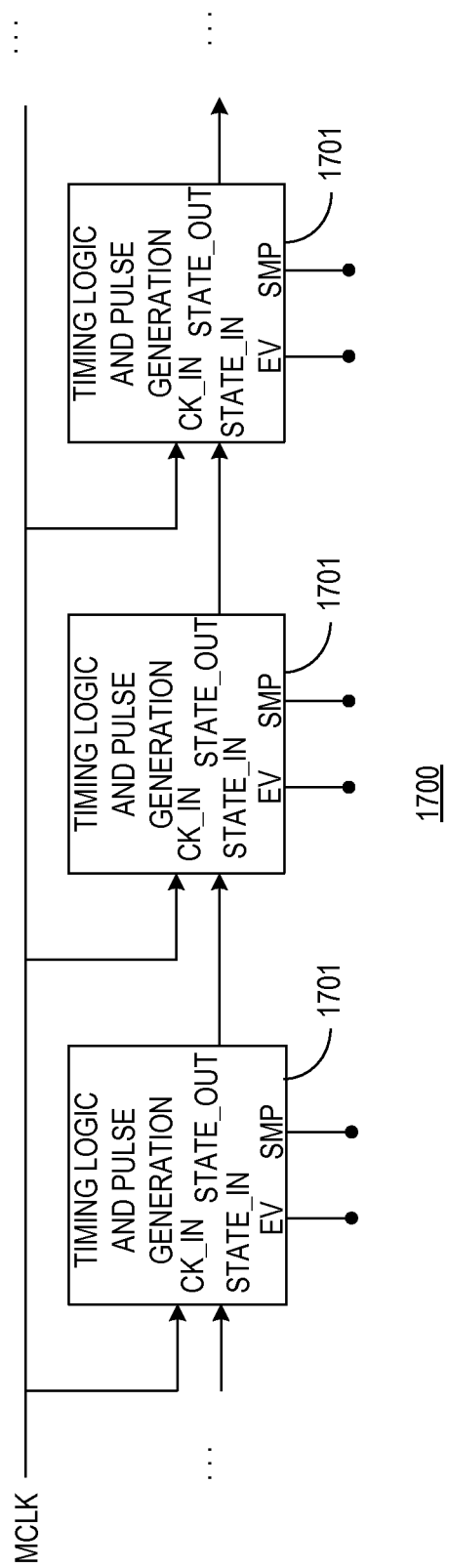
FIG. 17 is a block diagram of a system implemented with a general form of a logic block used for making a self-timed unit cell.

FIG. 17 is a block diagram of a system 1700 implemented with a general form of a logic block 1701 used for making a self-timed unit cell. Each block 1701 has a clock input CK_IN receiving a master clock signal MCLK and a state input STATE_IN receiving a state output from a previous block, and generates EV, SMP, and a state output signal STATE_OUT as outputs.

Figure 18A:
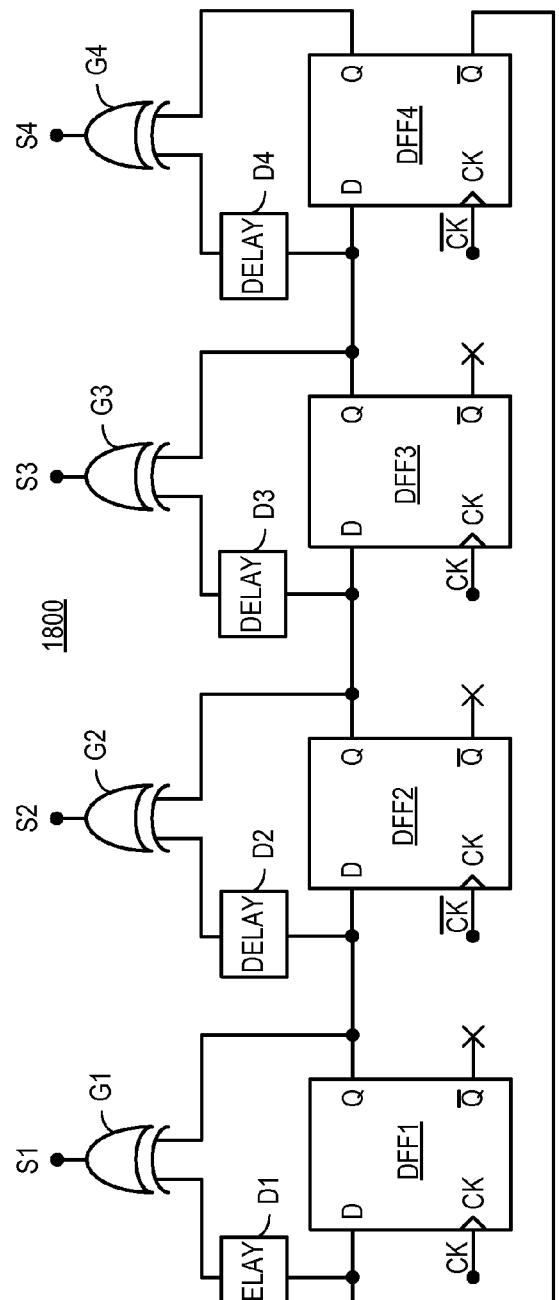
FIG. 18A is a schematic diagram of a sequential circuit that may be used in a more specific embodiment of the system of FIG. 17.
Figure 18B:
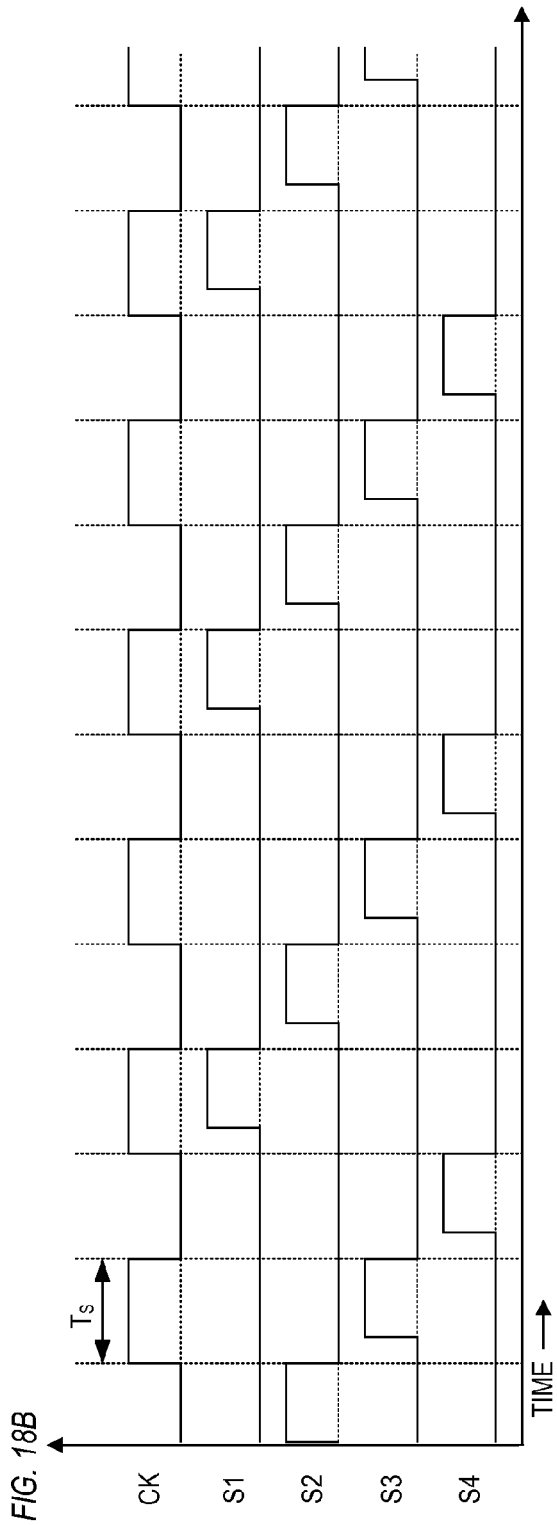
FIG. 18B is a corresponding timing diagram.

FIG. 18A is a schematic diagram of a sequential circuit 1800 that may be used in a more specific embodiment of the system 1700. The circuit 1800 includes four static D-type flip-flops (DFF) DFF1-DFF4, four delay blocks D1-D5, and four corresponding 2-input exclusive-OR (XOR) gates G1-G4. The $\overline{Q}$ inverted output of DFF4 is fed back to the D input of DFF1 and to an input of D1. The output of D1 is provided to one input of G1. The non-inverting output Q of DFF1 is provided to the other input of G1, to the D input of DFF2, and to the input of D2. The output of D2 is provided to one input of G2. The non-inverting output Q of DFF2 is provided to the other input of G2, to the D input of DFF3, and to the input of D3. The output of D3 is provided to one input of G3. The non-inverting output Q of DFF3 is provided to the other input of G3, to the D input of DFF4, and to the input of D4. The output of D4 is provided to one input of G4. The non-inverting output Q of DFF4 is provided to the other input of G4. The outputs of G1-G4 provide timing control signals S1-S4. DFF1 and DFF3 have clock inputs receiving a clock signal CK. DFF2 and DFF4 have clock inputs receiving a clock signal $\overline{CK}$, which is an inverted version of CK. FIG. 18B is a timing diagram plotting CK and S1-S4 versus time.

The S1-S4 signals are non-overlapping sampling pulses for 4 stages and may be generalized to N stages. For the Nth stage, SN is equivalent to the sample signal SMP and S(N−1) is reused as the evaluation signal EV for stage N as shown in FIG. 18A. It is noted that the clock input alternates between positive and negative polarity from one stage to the next so that the circuit 1800 produces pulses with a width of roughly ½ a clock cycle. Each delay block D1-D4 is a small time delay element, which may be implemented as multiple inverters, which effectively narrows each sampling pulse to prevent pulses from overlapping.

Figure 19A:
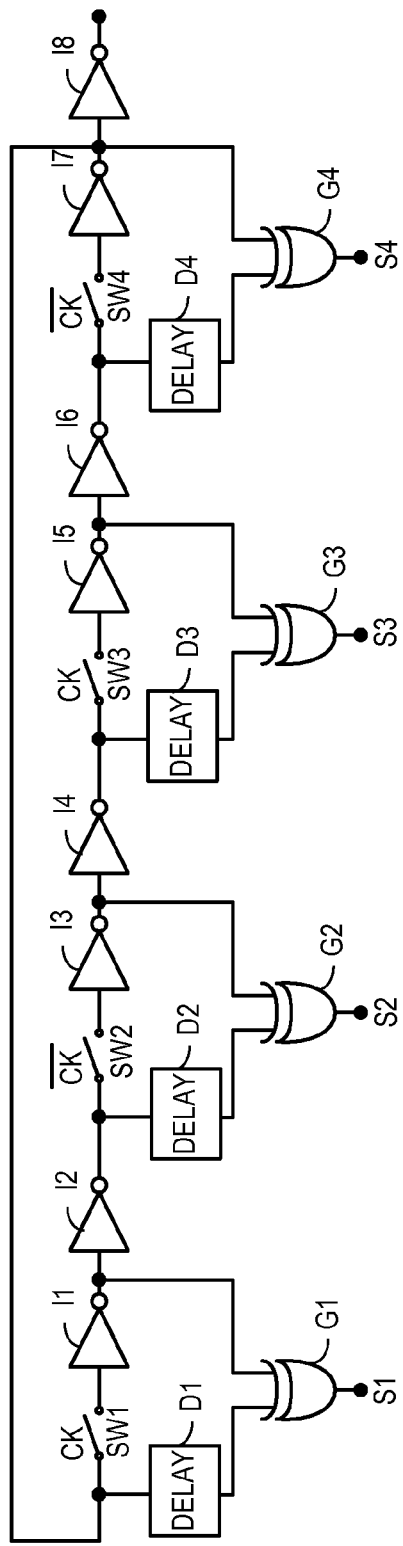
FIG. 19A is a schematic diagram of a dynamic circuit that may be used in a more specific embodiment of the system of FIG. 17.
Figure 19B:
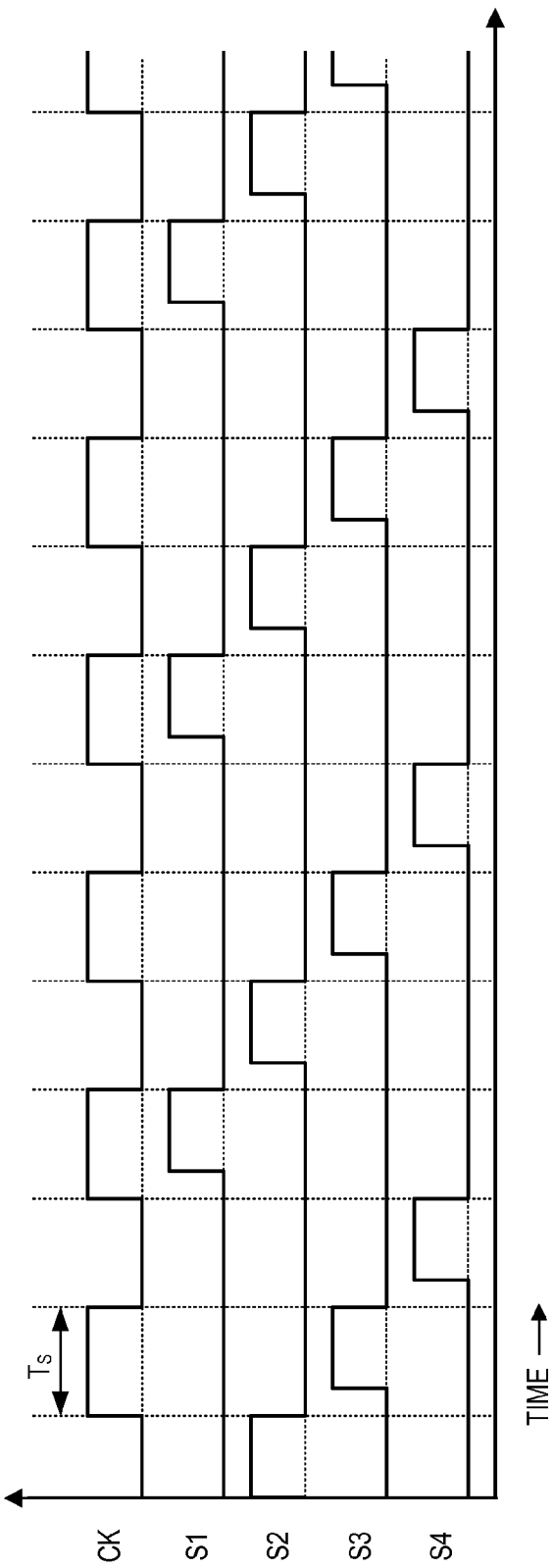
FIG. 19B is a corresponding timing diagram.

FIG. 19A is a schematic diagram of a dynamic circuit 1900 that may be used in another more specific embodiment of the system 1700. The circuit 1900 includes the four delay blocks D1-D4, four corresponding 2-input XOR gates G1-G4, four SPST switches SW1-SW4 and inverters I1-I8. The switches and inverters are coupled in series in the order SW1, I1, I2, SW2, I3, I4, SW3, I5, I6, SW4, I7 and I8. The switches SW1 and SW3 are controlled by a clock signal CK, and the switches SW2 and SW4 are controlled by the inverted clock signal $\overline{CK}$. The output of I7 is fed back to SW1 and to the input of D1, having its output coupled to one input of G1. The output of I1 is coupled to the other input of G1. The output of I2 is provided to the input of D2, having its output coupled to one input of G2. The output of I3 is coupled to the other input of G2. The output of I4 is provided to the input of D3, having its output coupled to one input of G3. The output of I5 is coupled to the other input of G3. The output of I6 is provided to the input of D4, having its output coupled to one input of G4. The output of I7 is coupled to the other input of G4. The outputs of G1-G4 provide the timing signals S1-S4. FIG. 19B is a timing diagram plotting CK and S1-S4 versus time.

The dynamic circuit 1900 is an implementation with ½ clock cycle pulse width, similar to the circuit 1800. The dynamic circuit 1900 is typically more compact and lower power than an equivalent static implementation.

FIG. 20A is a schematic diagram of another dynamic circuit 2000 which may be used in another more specific embodiment of the system 1700. The circuit 2000 includes the four delay blocks D1-D4, the four corresponding 2-input XOR gates G1-G4, eight SPST switches SW1-SW8 and inverters I1-I9. The switches and inverters are coupled in series in the order SW1, I1, SW2, SW3, I3, SW4, I4, SW5, I5, SW6, SW7, I7, SW8 and I8. The output of I8 is fed back to the input of another inverter I9, having it output provided back to SW1 and to the input of D1. The outputs of D1-D4 are each coupled to one input of the XOR gates G1-G4, respectively. The output of I2 is coupled to the other input of G1, the output of I4 is coupled to the other input of G2, the output of I6 is coupled to the other input of G3, and the output of I8 is coupled to the other input of G4. The switches SW1, SW3, SW5 and SW7 are controlled by the clock signal CK, and the switches SW2, SW4, SW6, and SW8 are controlled by the inverted clock signal $\overline{CK}$. The outputs of G1-G4 provide the timing signals S1-S4. FIG. 20B is a timing diagram plotting CK and S1-S4 versus time.

The dynamic circuit 2000 generates sampling pulses that are slightly less than 1 full clock period and hence each stage has both negative and positive polarities of the clock as input. Thus, for a given desired sampling clock frequency, the input clock frequency of the circuit 2000 may be two times higher than for the dynamic circuit 1900. In that sense, the dividers for the dynamic circuit 1900 typically offer a lower power implementation. On the other hand, the dynamic circuit 2000 is generally more convenient for reconfigurable filters as it does not need modification when using an odd-number of stages.

Figure 21A:
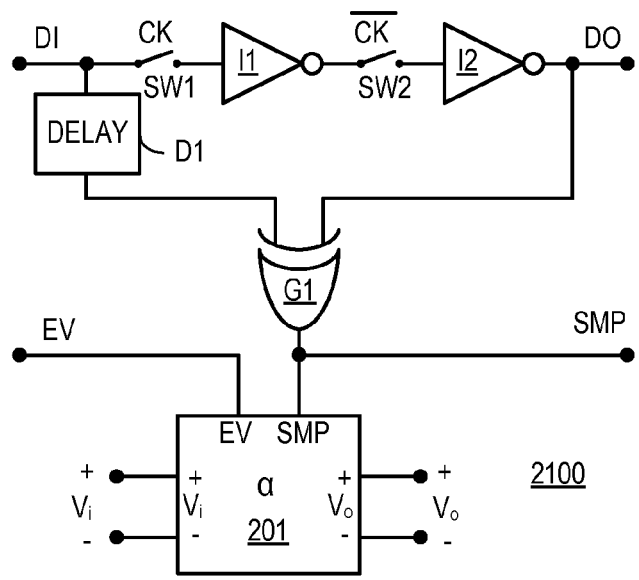
FIG. 21A is a schematic and block diagram of a self-timed charge storage cell using the divider structure of the dynamic circuit of FIG. 20A and the unit charge storage cell of FIG. 2A.
Figure 21B:
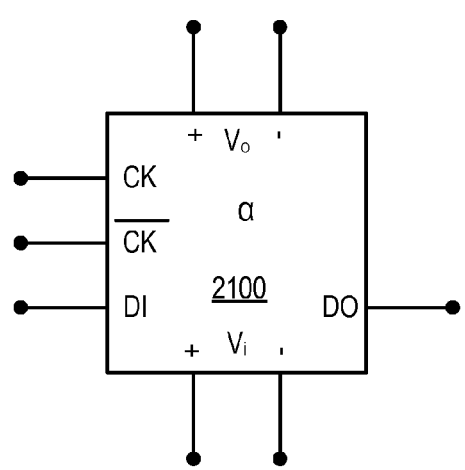
FIG. 21B is a corresponding circuit symbol.

FIG. 21A is a schematic and block diagram of a self-timed charge storage cell 2100 using the divider structure of the dynamic circuit 2000 and the unit charge storage cell 201. FIG. 21B is a corresponding circuit symbol representing the self-timed charge storage cell 2100. As shown, an input data signal DI is provided to one end of switch SW1 coupled in series with I1, SW2 and I2. The output of I2 provides a data output signal DO. DI is provided to the input of delay block D1, having its output coupled to one end of XOR gate G1, which receives DO at its other input and which provides a sample timing signal SMP at its output. SMP is provided to the SMP input of a unit charge storage cell 201, which receives an evaluation timing signal EV at its EV input. The unit charge storage cell 201 samples the input signal $V_i$ and provides an output signal $V_o$ as previously described. The self-timed charge storage cell 2100 is suited for a fixed coefficient filter implementation in which tap weight and output polarity need not be programmable.

Figure 22A:
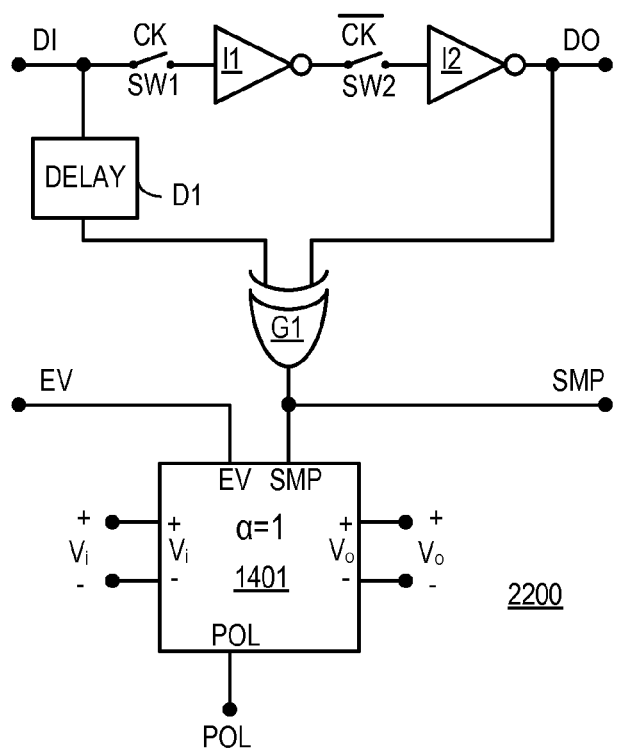
FIG. 22A is a schematic and block diagram of another self-timed charge storage cell using the divider structure of the dynamic circuit of FIG. 20A and further using the programmable charge storage cell of FIG. 14A.
Figure 22B:
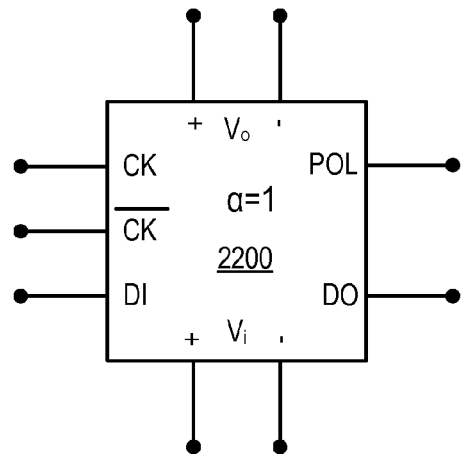
FIG. 22B is a corresponding circuit symbol.

FIG. 22A is a schematic and block diagram of another self-timed charge storage cell 2200 using the divider structure of the dynamic circuit 2000 and further using the programmable charge storage cell 1401. FIG. 22B is a corresponding circuit symbol representing the self-timed charge storage cell 2200. The self-timed charge storage cell 2200 is substantially similar to the self-timed charge storage cell 2100 except that the unit charge storage cell 201 is replaced by the programmable charge storage cell 1401, which also receives a polarity input signal POL as previously described. The programmable charge storage cell 1401 also samples the input signal $V_i$ and provides an output signal $V_o$. In this case, the self-timed charge storage cell 2200 is suited for a programmable coefficient filter implementation.

Figure 23:
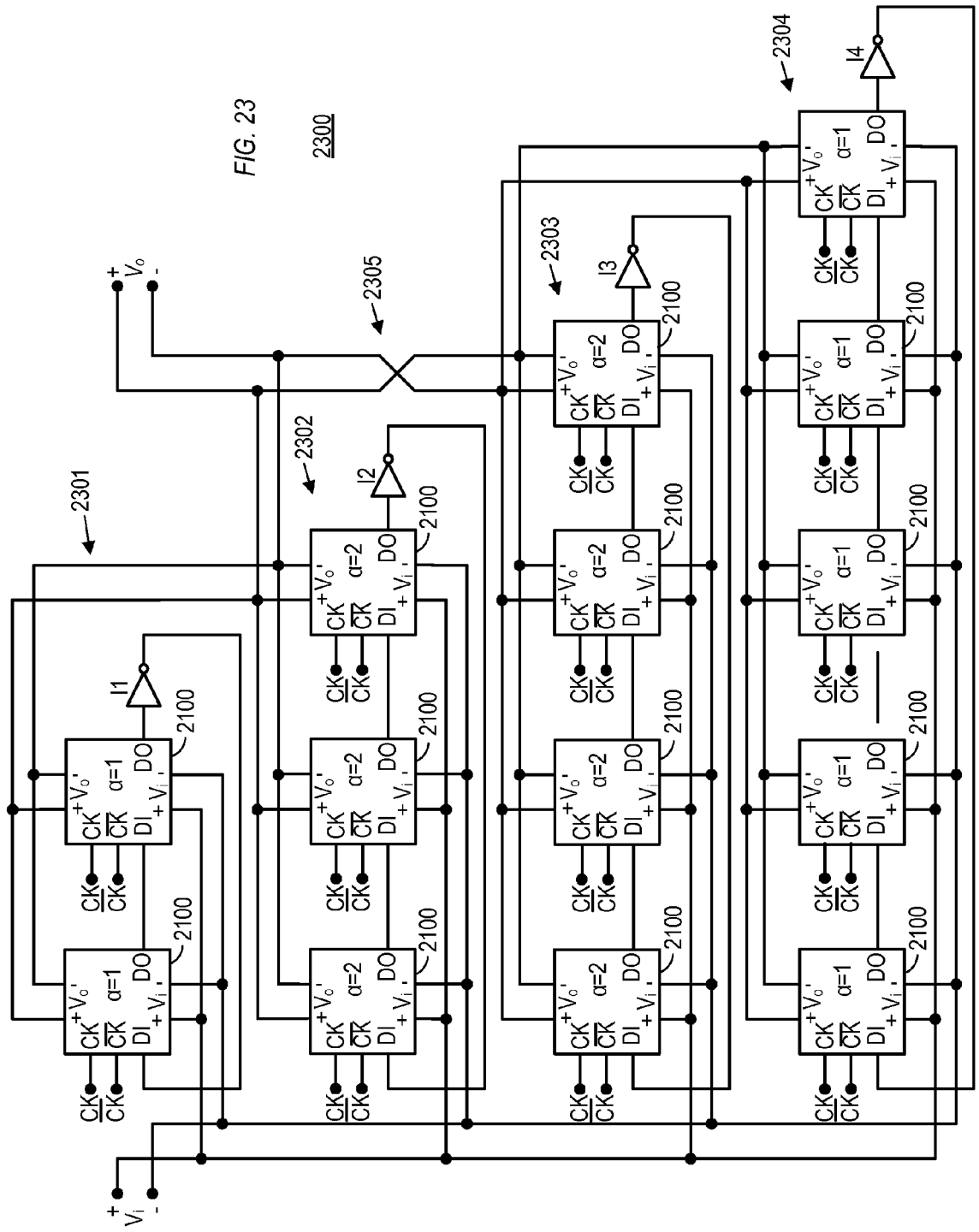
FIG. 23 is a schematic and block diagram of a 4-tap filter implemented using an array of the self-timed charge storage cells of FIG. 21.

FIG. 23 is a schematic and block diagram of a 4-tap filter 2300 implemented using an array of the self-timed charge storage cells 2100. The filter 2300 includes taps 2301, 2302, 2303 and 2304 with corresponding tap weights of 1, 2, −2 and −1, respectively. Each of the self-timed charge storage cells 2100 receives the differential clock (CK, $\overline{CK}$) for timing as previously described. The first tap 2301 includes two cells 2100 each with weight factor α=1 and collectively coupled in a daisy-chain structure, in which the data output DO of the first cell 2100 feeds the data input DI of the second cell 2100. The data output DO of the second cell 2100 is inverted by inverter I1 and fed back to the data input DI of the first cell 2100. The second tap 2302 includes three cells 2100 each with weight factor α=2 and collectively configured in a daisy-chain structure, in which the data output DO of the first cell 2100 feeds the data input DI of the second cell 2100, the data output DO of the second cell 2100 feeds the data input DI of the third cell 2100, and where the data output DO of the third cell 2100 is inverted by inverter I2 and fed back to the data input DI of the first cell 2100. The third tap 2303 includes four cells 2100 each with weight factor α=2 and coupled in a similar daisy-chain structure as the taps 2301 and 2302, in which the DO output of the fourth cell 2100 is inverted by inverter I3 and fed back to the DI input of the first cell 2100. Likewise, the fourth tap 2304 includes five cells 2100 each with weight factor α=1 and coupled in a similar daisy-chain structure, in which the DO output of the fifth cell 2100 is inverted by inverter I4 and fed back to the DI input of the first cell 2100. The polarity of the third and fourth taps 2303 and 2304 are reversed by a crossover coupling 2305 to invert their tap weights relative to the first taps 2301 and 2302.

The filter structure of 4-tap filter 2300 is similar to that of the 4-tap filter 500, in which a primary difference is in the method by which the pulses are generated. For the filter 500, the 14 independent dedicated sampling timing signals A1-A2, B1-B3, C1-C4 and D1-D5 specified in the timing diagram of FIG. 5B are generated by an external source and routed or otherwise delivered to each of the cells. The filter 2300, on the other hand, has the same impulse response but, because the cells 2100 are self-timed, the differential clock (CK, $\overline{CK}$) is the only external timing signal used by the filter. The additional inverter at the end of each tap is used to insure that the total number of polarity inversions of the digital state within any tap remains odd.

The filter coefficients of the 4-tap filter 2300 may be made programmable using the tunable capacitor technique illustrated by the 4-tap filter 1300 using the programmable charge storage cells 1311 combined with a programmable output polarity. Each of the programmable charge storage cells 1311 is substantially the same as the programmable charge storage cell 1201 (with a different number of discrete programmable levels).

Figure 24:
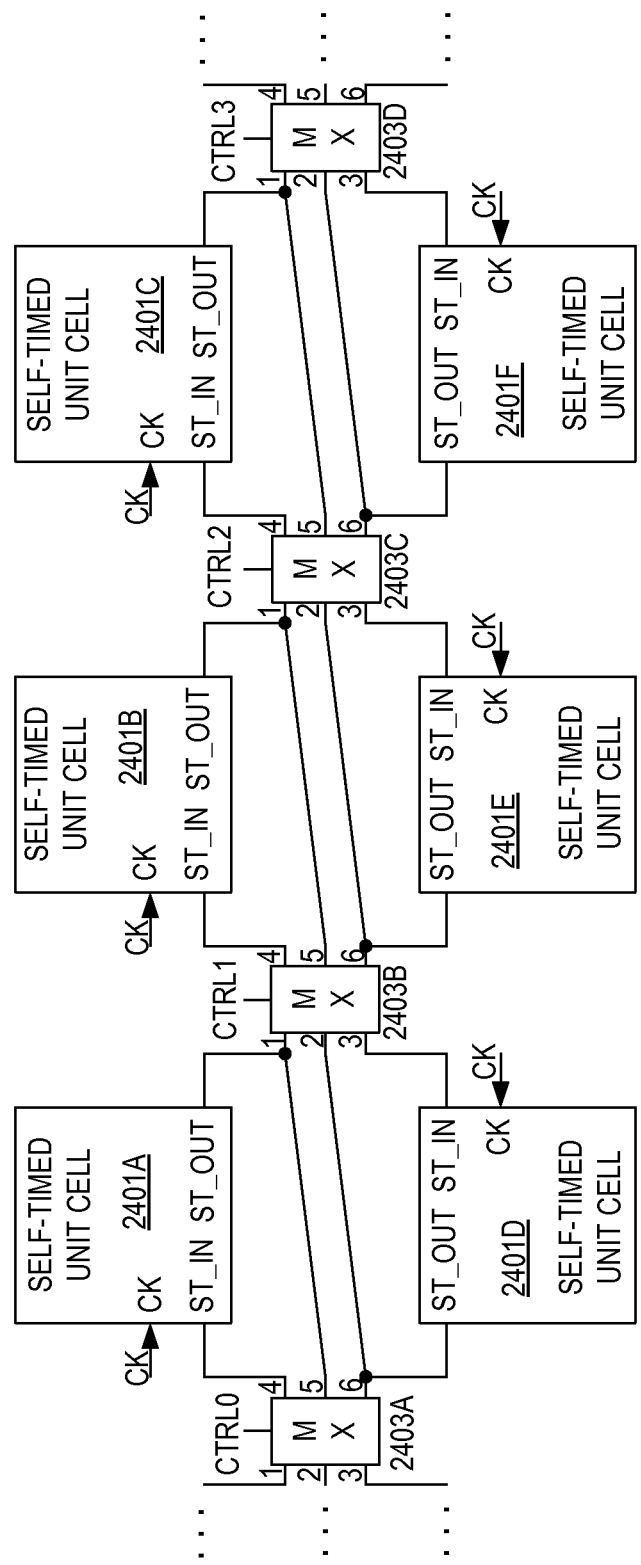
FIG. 24 is a simplified block diagram of a self-timed filter with programmable coefficients according to one embodiment.

FIG. 24 is a simplified block diagram of a self-timed filter 2400 with programmable coefficients according to one embodiment. The coefficients are programmed in essentially a similar manner as that described for the filters 1500 and 1501 in which unit-cells within the array of cells may be reconfigured into subgroups of taps by manipulating the evaluation and sample signals driving each cell. As with the filter 2300, however, the filter 2400 employs a self-timed approach in which the differential clock (shown as CK) is the external dynamic signal provided for sample timing for each array configuration.

A tap within the self-timed filter comprises a group of unit-cells that send and receive state information between adjacent cells, collectively coordinating their sample and evaluation signals so that a sampled input waits a desired number clock cycles before it is connected to the output. Hence, in order to build an array of self-timed unit-cells that is reconfigurable, additional logic circuitry is used to allow control over which adjacent cell a given cell should send its state information. Essentially, a multiple input/output multiplexer (MUX) may be built into the array structure to allow the state information of each cell to be rerouted between neighboring cells as desired to form subgroups of cells, or taps. This is illustrated conceptually by the filter 2400, in which an array of 6 self-timed unit cells may be reconfigured into various subgroups to demonstrate its flexibility. With an array of N self-timed unit cells, any filter satisfying equation (8) may be constructed.

The filter 2400 is shown having six self-timed unit cells 2401A, 2401B, 2401C, 2401D, 2401E and 2401F (2401A-2401F) each having a clock input receiving CK, a state information input ST_IN and a state information output ST_OUT. The filter 2400 further includes four multiplexers (MX) 2403A, 2403B, 2403C, and 2403D (2403A-2403D) each having six data input/output (I/O) terminals and a control input for receiving control signals for configuring the I/O terminals. MX 2403A receives CTRL0, MX 2403B receives CTRL1, MX 2403C receives CTRL2, and MX 2403D receives CTRL3. Each MX has 6 I/O terminals individually numbered 1-6. The first MX 2403A receives state information from other circuitry (not shown) as indicated by ellipses adjacent its I/O terminals 1-3 and the last MX 2403D provides state information to other circuitry (not shown) as indicated by ellipses adjacent its I/O terminals 4-6. The I/O terminal 4 of MX 2403A, 2403B and 2403C is coupled to the ST_IN input of cells 2401A, 2401B and 2401C, respectively. The I/O terminal 5 of MX 2403A, 2403B and 2403C is coupled to the ST_OUT output of cells 2401A, 2401B and 2401C, respectively, and to the I/O terminal 1 of MX 2403B, 2403C and 2403D, respectively. The I/O terminal 6 of MX 2403A, 2403B and 2403C is coupled to the ST_OUT output of cells 2401D, 2401E and 2401F, respectively, and to the I/O terminal 2 of MX 2403B, 2403C and 2403D, respectively. The control inputs CTRL0_CRTL3 are adjusted to configure the filter 2400 in the desired manner as further described herein.

Figure 25A:
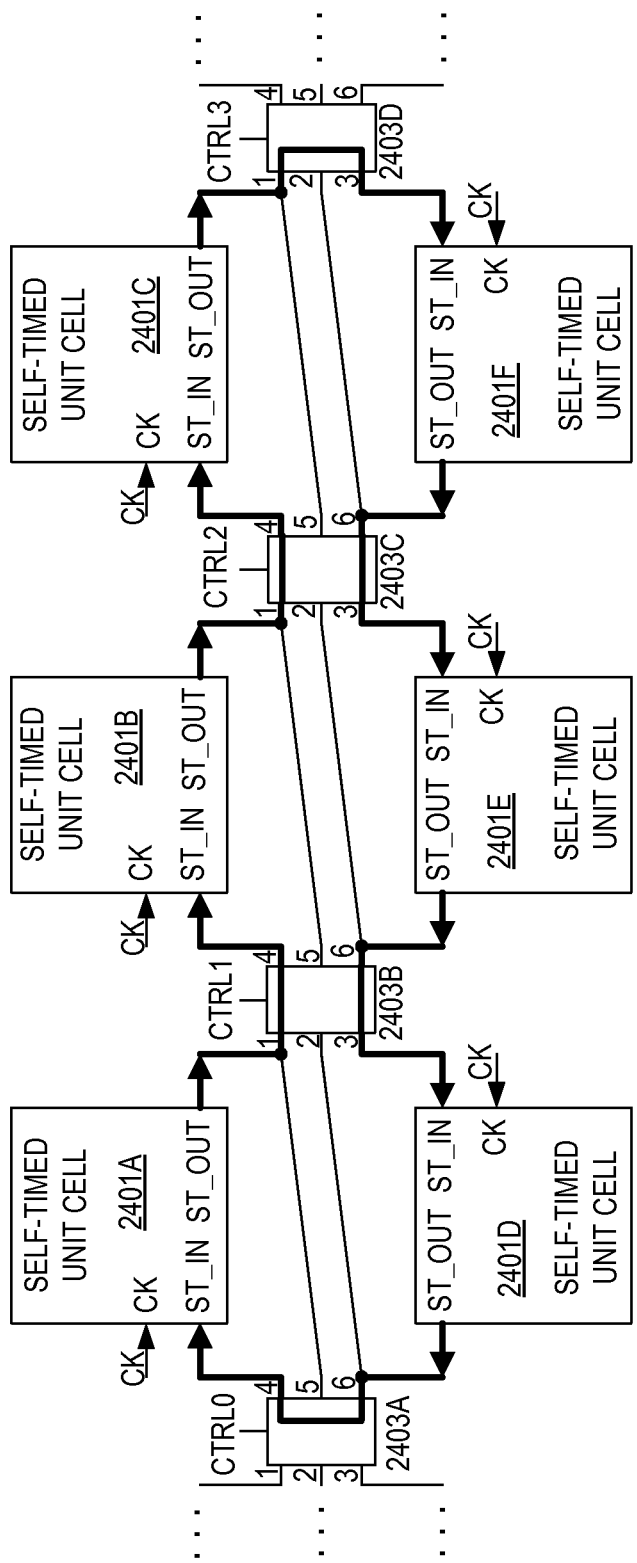
FIGS. 25A, 25B and 25C are simplified block diagram of self-timed filters each implemented with the filter of FIG. 24 having its multiplexers programmed by the control signals to reconfigure the unit cells within the array to achieve different sub-group configurations.
Figure 25B:
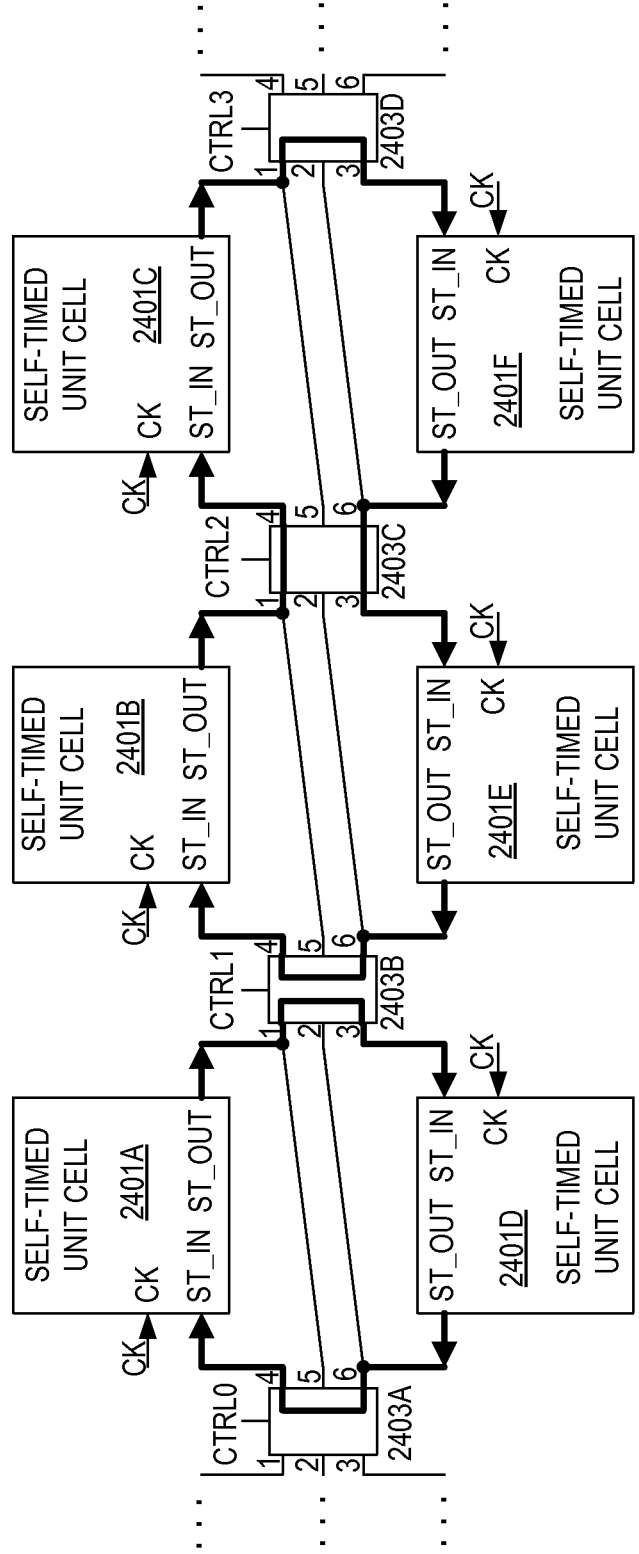
Figure 25C:
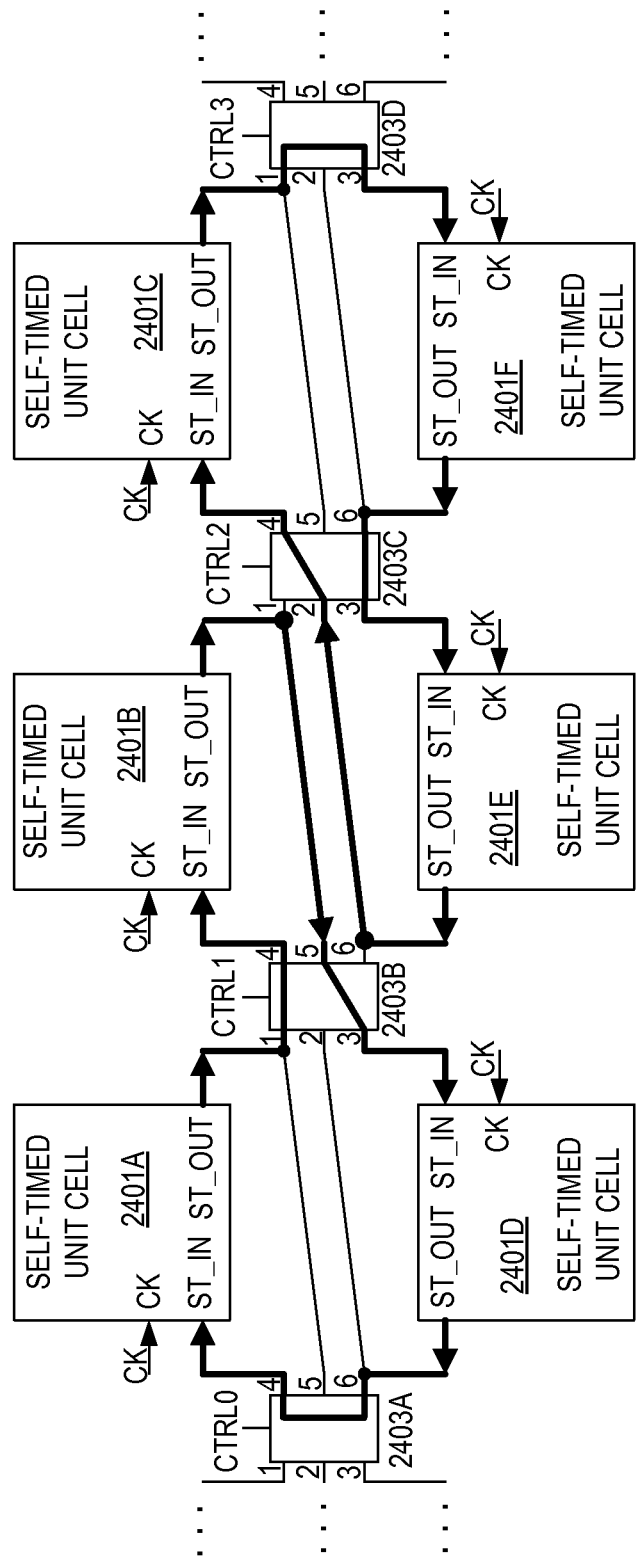

FIGS. 25A, 25B and 25C are simplified block diagram of self-timed filters 2400A, 2400B and 2400C, respectively, each implemented with the filter 2400 having its multiplexers programmed by the control signals CTRL0_CTRL 3 to reconfigure the unit cells within the array to achieve different sub-group configurations. In each case, bolded lines indicate programming of the multiplexers and the corresponding active signal paths defining the subgroups or taps formed within the array.

As shown in FIG. 25A, MX 2403A of the filter 2400A is programmed to couple its I/O terminals 4 and 6 together, MX 2403B is programmed to couple its I/O terminals 1 and 4 together and to couple its I/O terminals 3 and 6 together, MX 2403C is programmed to couple its I/O terminals 1 and 4 together and to couple its I/O terminals 3 and 6 together, and MX 2403D is programmed to couple its I/O terminals 1 and 3 together. Thus, for the filter 2400A, the cells 2401A-2401F are collectively formed into a single group with a delay of five.

As shown in FIG. 25B, MX 2403A of the filter 2400B is programmed to couple its I/O terminals 4 and 6 together, MX 2403B is programmed to couple its I/O terminals 1 and 3 together and to couple its I/O terminals 4 and 6 together, MX 2403C is programmed to couple its I/O terminals 1 and 4 together and to couple its I/O terminals 3 and 6 together, and MX 2403D is programmed to couple its I/O terminals 1 and 3 together. In this case for the filter 2400B, the cells 2401A and 2401D form a first group of two cells and the cells 2401B, 2401C, 2401E and 2401F form a second group of four cells.

As shown in FIG. 25C, MX 2403A of the filter 2400C is programmed to couple its I/O terminals 4 and 6 together, MX 2403B is programmed to couple its I/O terminals 1 and 4 together and to couple its I/O terminals 3 and 5 together, MX 2403C is programmed to couple its I/O terminals 2 and 4 together and to couple its I/O terminals 3 and 6 together, and MX 2403D is programmed to couple its I/O terminals 1 and 3 together. In this case for the filter 2400C, the cells 2401A, 2401B and 2401D form a first group of three cells and the cells 2401C, 2401E and 2401F form a second group of three cells.

Although the present invention has been described in considerable detail with reference to certain preferred versions thereof, other versions and variations are possible and contemplated. Those skilled in the art should appreciate that they can readily use the disclosed conception and specific embodiments as a basis for designing or modifying other structures for carrying out the same purposes of the present invention without departing from the spirit and scope of the invention as defined by the appended claims.

The invention claimed is:

1. A discrete-time analog filter, comprising:
   a plurality of storage cells each coupled to an input port and to an output port, wherein each of said plurality of storage cells comprises at least one of a plurality of capacitors and at least one of a plurality of switches;
   wherein each of said plurality of storage cells is controlled to periodically sample an input signal at said input port at a corresponding one of a plurality of sampling frequencies to periodically provide samples at said output port to contribute to an output signal, wherein said output signal comprises a combination of samples captured from said input port at said plurality of sampling frequencies; and
   wherein said plurality of switches are controlled to combine at least a portion of said plurality of capacitors in series to increase a voltage amplitude of said output signal.

2. A discrete-time analog filter according to claim 1, wherein each of said plurality of storage cells which samples said input signal at a first frequency are grouped together into a filter tap, and wherein said filter tap implements a specified time delay between sampling said input signal and providing samples at said output port.

3. A discrete-time analog filter according to claim 1, wherein:
   said plurality of storage cells comprises at least two storage cells within a filter tap including a first storage cell and a second storage cell;
   wherein said first storage cell samples said input signal based on a first timing signal at a first frequency;
   wherein said second storage cell samples said input signal based on a second timing signal at said first frequency; and
   wherein said first and second timing signals comprise non-overlapping phases of said first frequency.

4. A discrete-time analog filter according to claim 3, wherein said first and second storage cells have substantially equal capacitance.

5. A discrete-time analog filter according to claim 1, wherein said plurality of storage cells are grouped into a plurality of filter taps, wherein each of said plurality of filter taps samples said input signal in response to a corresponding plurality of timing signals which comprise non-overlapping phases of a corresponding one of said plurality of different frequencies.

6. A discrete-time analog filter according to claim 1, wherein said plurality of storage cells are grouped into a plurality of filter taps each including a different number of said plurality of storage cells.

7. A discrete-time analog filter according to claim 6, wherein each of said plurality of storage cells of each of said plurality of filter taps comprises a capacitance associated with a corresponding weighting coefficient.

8. A discrete-time analog filter according to claim 6, wherein at least two of said plurality of filter taps have different weighting coefficients.

9. A discrete-time analog filter according to claim 6, wherein an output of at least one of said plurality of taps is reversed relative to an output of another one of said plurality of filter taps at said output port to effectuate a negative weighting coefficient.

10. A discrete-time analog filter according to claim 6, further comprising a plurality of gain switches coupled to outputs of said plurality of filter taps and controlled by at least one gain signal for programming gain.

11. A discrete-time analog filter according to claim 1, wherein at least one of said plurality of storage cells comprises at least two of said plurality of capacitors, at least two of said plurality of switches, and select logic with a select input for configuring said at least two of said plurality of switches to program a gain of said at least one of said plurality of storage cells.

12. A discrete-time analog filter according to claim 1, wherein at least one of said plurality of storage cells comprises a predetermined number of capacitors which are combined to achieve a corresponding voltage gain greater than one.

13. A discrete-time analog filter according to claim 1, wherein at least one of said plurality of storage cells comprises at least two of said plurality of capacitors which are individually selectable to program a weighting coefficient.

14. A discrete-time analog filter according to claim 1, wherein said plurality of storage cells are grouped into a plurality of filter taps, wherein said plurality of filter taps are grouped into a plurality of sub-filters, and wherein outputs of said plurality of sub-filters are arranged to sum output voltages of said plurality of sub-filters.

15. A discrete-time analog filter according to claim 1, further comprising a plurality of gain select switches, wherein said plurality of storage cells are grouped into a plurality of filter taps, wherein said plurality of filter taps are grouped into a plurality of sub-filters, and wherein said plurality gain select switches are programmable to selectively sum output voltages of said plurality of sub-filters.

16. A discrete-time analog filter according to claim 1, wherein at least one of said plurality of storage cells includes polarity select logic with a polarity select input to program an output polarity of said at least one of said plurality of storage cells.

17. A discrete-time analog filter according to claim 1, wherein each of said plurality of storage cells comprises a self-timed cell controlled by a master clock signal.

* * * * *